US011777046B2

(12) United States Patent
Topping

(10) Patent No.: US 11,777,046 B2
(45) Date of Patent: Oct. 3, 2023

(54) ENERGY STORAGE

(71) Applicant: POWER ROLL LIMITED, Sunderland (GB)

(72) Inventor: Alexander John Topping, Sunderland (GB)

(73) Assignee: POWER ROLL LIMITED, Sunderland (GB)

( * ) Notice: Subject to any disclaimer, the term of this patent is extended or adjusted under 35 U.S.C. 154(b) by 178 days.

(21) Appl. No.: 17/201,719

(22) Filed: Mar. 15, 2021

(65) Prior Publication Data

US 2021/0202771 A1 Jul. 1, 2021

Related U.S. Application Data

(63) Continuation of application No. 16/341,233, filed as application No. PCT/GB2017/053042 on Oct. 6, 2017, now Pat. No. 10,978,603.

(30) Foreign Application Priority Data

Oct. 11, 2016 (GB) ...................... 1617276
Aug. 10, 2017 (GB) ...................... 1712877

(51) Int. Cl.
| H01L 31/053 | (2014.01) |
| H01G 9/20 | (2006.01) |
| H01G 11/28 | (2013.01) |
| H01G 11/70 | (2013.01) |
| H01L 31/0352 | (2006.01) |

(Continued)

(52) U.S. Cl.
CPC ........... *H01L 31/053* (2014.12); *H01G 9/209* (2013.01); *H01G 9/2068* (2013.01); *H01G 11/28* (2013.01); *H01G 11/70* (2013.01); *H01L 31/035281* (2013.01); *H01L 31/0445* (2014.12);
(Continued)

(58) Field of Classification Search
CPC ........ Y02E 60/13; H01G 11/28; H01G 11/70; H01G 9/2095; H01L 31/053; H01L 31/035281
See application file for complete search history.

(56) References Cited

U.S. PATENT DOCUMENTS 3,948,682 A 4/1976 Bordina et al.
4,110,122 A 8/1978 Kaplow et al.
(Continued)

FOREIGN PATENT DOCUMENTS

CN 1787173 A 6/2006
DE 19943720 A1 5/2000
(Continued)

OTHER PUBLICATIONS

Examination report dated Mar. 22, 2021 in IN Application 201734035991.
(Continued)

*Primary Examiner* — John A Bodnar
(74) *Attorney, Agent, or Firm* — Meunier Carlin & Curfman LLC

(57) ABSTRACT

An energy storage device comprising a substrate comprising a groove having a first and a second face. A capacitor material in the groove. The first and the second face of the groove having a coat of metal. Wherein the coat of metal on the first face is not in electrical contact with the coat of metal on the second face.

16 Claims, 13 Drawing Sheets

(51) Int. Cl.
  *H01L 31/0445* (2014.01)
  *H01L 31/05* (2014.01)
  *H01L 31/046* (2014.01)

(52) U.S. Cl.
  CPC ....... *H01L 31/0504* (2013.01); *H01G 9/2095* (2013.01); *H01L 31/046* (2014.12); *Y02E 10/50* (2013.01)

(56) References Cited

U.S. PATENT DOCUMENTS

| | | | |
|---|---|---|---|
| 4,283,589 | A | 8/1981 | Kaplow et al. |
| 4,295,002 | A | 10/1981 | Chappell et al. |
| 4,335,503 | A | 6/1982 | Evans, Jr. et al. |
| 4,379,944 | A | 4/1983 | Borden et al. |
| 4,893,214 | A * | 1/1990 | Nishiwaki ............ G01N 27/225 29/25.42 |
| 5,067,985 | A | 11/1991 | Carver et al. |
| 5,689,358 | A | 11/1997 | Nakao et al. |
| 5,879,943 | A | 3/1999 | Ando et al. |
| 6,084,175 | A | 7/2000 | Perry et al. |
| 6,090,661 | A | 7/2000 | Perng et al. |
| 6,445,565 | B1 | 9/2002 | Toyoda et al. |
| 6,762,359 | B2 | 7/2004 | Asai et al. |
| 2004/0238833 | A1 | 12/2004 | Nakata et al. |
| 2005/0022860 | A1 | 2/2005 | Toh |
| 2007/0034250 | A1 | 2/2007 | Dutta et al. |
| 2008/0202581 | A1 | 8/2008 | Kempa |
| 2009/0014056 | A1 | 1/2009 | Hockaday et al. |
| 2010/0089443 | A1 | 4/2010 | Bloomstein et al. |
| 2010/0244056 | A1 | 9/2010 | Ray et al. |
| 2010/0275964 | A1 | 11/2010 | Kinoshita |
| 2010/0294536 | A1 | 11/2010 | Usami et al. |
| 2010/0294539 | A1 | 11/2010 | Sasaki et al. |
| 2011/0036391 | A1 | 2/2011 | McCormick et al. |
| 2011/0290323 | A1 | 12/2011 | Lee et al. |
| 2012/0012982 | A1 | 1/2012 | Korec et al. |
| 2012/0080087 | A1 | 4/2012 | Denby et al. |
| 2012/0298175 | A1 | 11/2012 | Van Roosmalen et al. |
| 2013/0160818 | A1 | 6/2013 | Li et al. |
| 2013/0175666 | A1 | 7/2013 | Tran et al. |
| 2013/0298980 | A1 | 11/2013 | Fogel et al. |
| 2014/0238461 | A1 | 8/2014 | Luo et al. |
| 2015/0372176 | A1 | 12/2015 | Topping |
| 2016/0094072 | A1 | 3/2016 | Chen et al. |

FOREIGN PATENT DOCUMENTS

| | | |
|---|---|---|
| DE | 19937724 C1 | 12/2000 |
| EP | 0181162 A2 | 5/1986 |
| EP | 0392676 A2 | 10/1990 |
| EP | 1427026 A1 | 6/2004 |
| EP | 2256820 A2 | 12/2010 |
| GB | 2210462 A | 6/1989 |
| GB | 2549133 A | 10/2017 |
| JP | S6135573 Y2 | 2/1986 |
| JP | S6486053 A | 3/1989 |
| JP | H02272777 A | 11/1990 |
| JP | H0523124 U | 3/1993 |
| JP | H0724282 A | 1/1995 |
| JP | H0886752 A | 6/2000 |
| JP | 2002243689 A | 8/2002 |
| JP | 2009059990 A | 3/2009 |
| JP | 2010529599 A | 8/2010 |
| JP | 2012049542 A | 3/2012 |
| JP | 2014154598 A | 8/2014 |
| WO | 2002059981 A2 | 8/2002 |
| WO | 2007124725 A1 | 11/2007 |
| WO | 2011034908 A1 | 3/2011 |
| WO | 2012144534 A1 | 10/2012 |
| WO | 2012175902 A1 | 12/2012 |
| WO | 2014118545 A1 | 8/2014 |
| WO | 2014131059 A1 | 8/2014 |
| WO | 2015145166 A1 | 10/2015 |
| WO | 2017174993 A1 | 10/2017 |
| WO | 2017174996 A1 | 10/2017 |
| WO | 2017174997 A1 | 10/2017 |
| WO | 2018069681 | 4/2018 |

OTHER PUBLICATIONS

Combined search and examination report dated Jan. 18, 2018 in related GB application GB 1716426.0 (11 pages).

Hezel, R., "Novel back contact silicon solar cells designed for very high efficiencies and low-cost mass production", Conference Record of the 29th IEEE Photovoltaic Specialists Conference 2002, vol. 29, May 19, 2002-May 24, 2002, pp. 114-117.

Kilmova, et al., "High-Voltage Photovoltaic Cells with Alloyed Aluminum Contacts", Applied Solar Energy, 1992, 28(3), 20-24.

International Preliminary Report on Patentability dated Apr. 25, 2019 in International Application No. PCT/GB2017/053041 (11 pages).

International Search Report and Written Opinion dated Feb. 26, 2018 in International Application No. PCT/GB2017/053041 (14 pages).

International Preliminary Report on Patentability dated Apr. 25, 2019 in International Application No. PCT/GB2017/053042 (12 pages).

International Search Report and Written Opinion dated Feb. 26, 2018 in International Application No. PCT/GB2017/053042 (16 pages).

Robertson, J., "High dielectric constant oxides", The European Physical Journal Applied Physics, 2004, 28, 265-291.

Sturm, et al., "Chemical Vapor Deposition Epitaxy of Silicon-based Materials using Neopentasilane", ECS Transactions, 2008, 16(10), 799-805.

Wronski, , "Schottky-barrier characteristics of metal-amorphous-silicon diodes", Applied Physics Letters, 1975, 29(9), 1.

Examination Report dated Jun. 15, 2021 in corresponding Japanese application No. 2019-519392, with English machine translation.

* cited by examiner

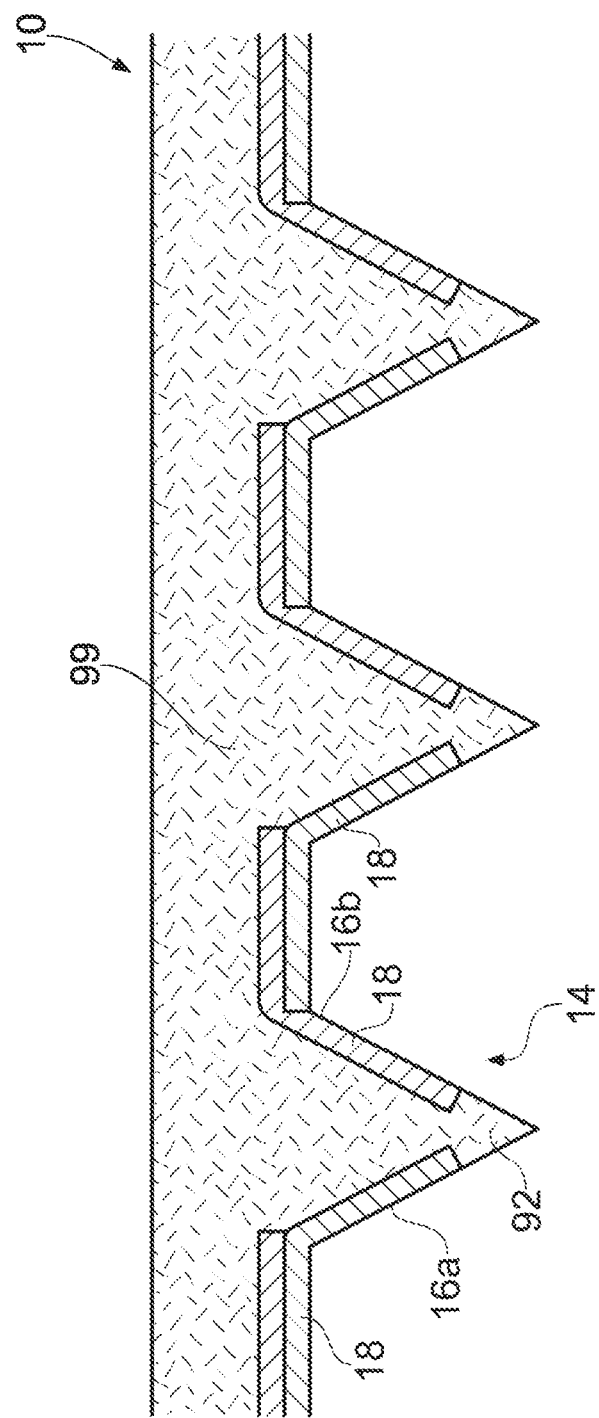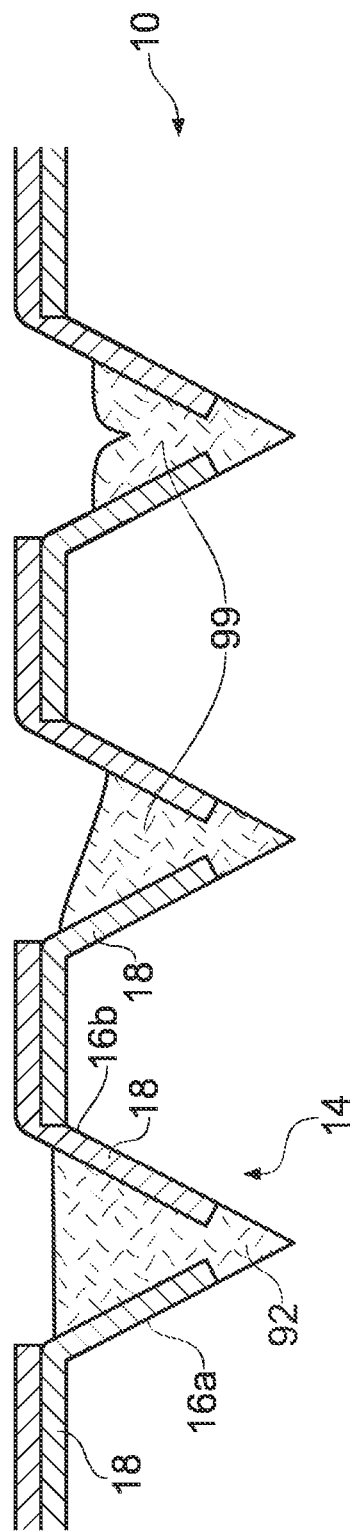

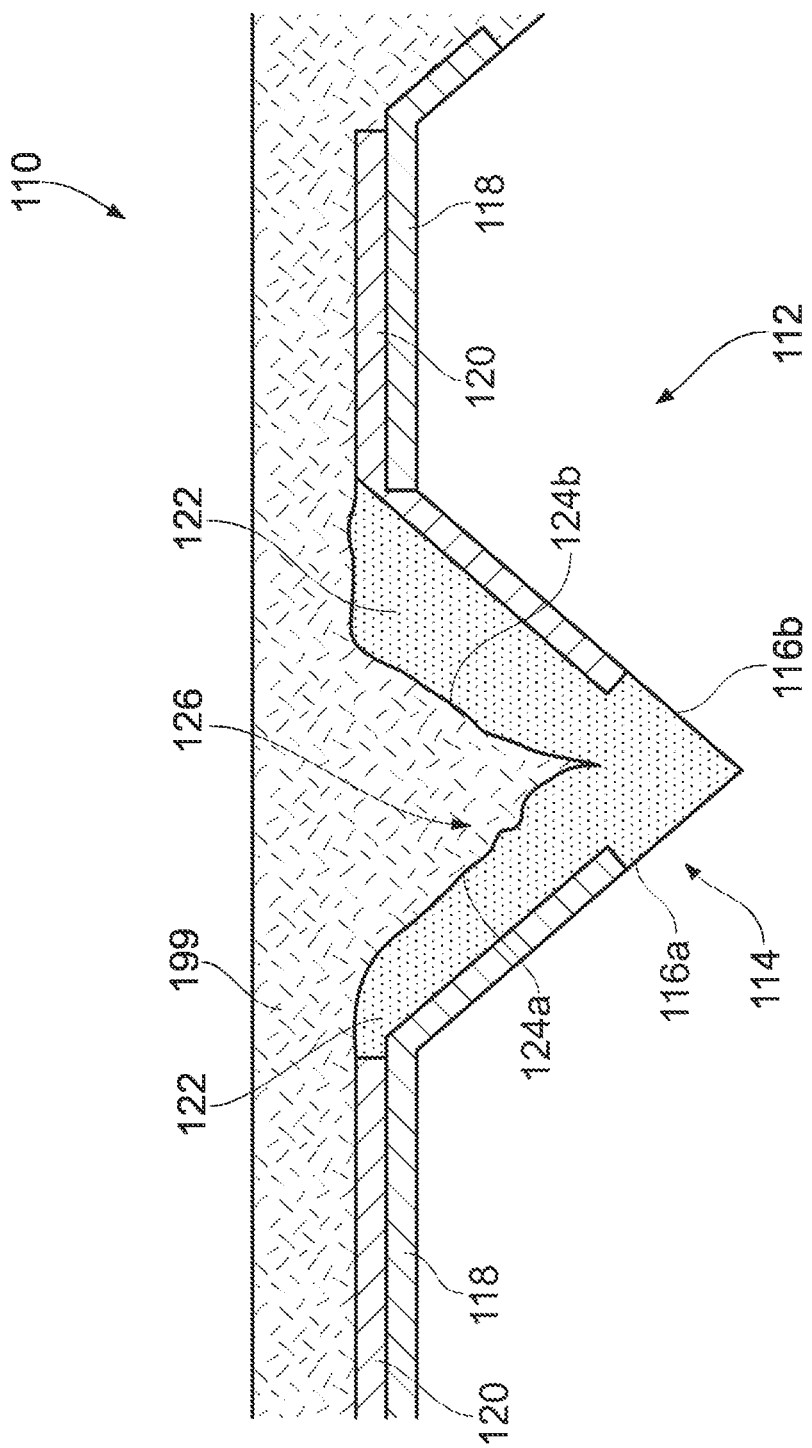

ENERGY STORAGE

CROSS REFERENCE TO RELATED APPLICATIONS

This application is a continuation of U.S. application Ser. No. 16/341,233 filed Apr. 11, 2019, which is a national stage application filed under 35 U.S.C. § 371 of PCT/GB2017/053042 filed Oct. 6, 2017, which claims priority to and benefit of United Kingdom patent application serial number 1712877.8 filed Aug. 10, 2017 and United Kingdom patent application serial number 1617276.9 filed Oct. 11, 2016; the contents of which are incorporated herein by reference in their entirety.

The present invention relates to an energy storage device.

The demand for sources of renewable energy has driven significant improvements in the cost and efficiency of solar photovoltaic cells but existing technology still represents a relatively expensive method of generating electricity.

The demand for sources of renewable energy has also driven improvements in energy storage. The efficiency of energy storage must be increased and/or the cost of energy storage must be decreased, if renewable energy is going to meet more of the world's energy demand.

The present invention aims to mitigate one or more of the disadvantages of existing energy storage devices.

In accordance with a first aspect of the present invention there is provided an energy storage device comprising:

a substrate comprising a groove having a first and a second face;

wherein there is a capacitor or supercapacitor material in the groove.

It may be an advantage of the present invention that the device provides a reliable way to store energy and in particular the device is less prone to short circuits compared to other known storage devices. Short circuits adversely affect the capacitance of the capacitor or supercapacitor.

The capacitor material may have characteristics of a supercapacitor. It is optionally a supercapacitor material in the groove. The capacitor material may be a high dielectric capacitor material. It is normally a high dielectric capacitor material in the groove.

The energy storage device is typically an electrical energy storage device.

When the capacitor or supercapacitor material is in the groove, the capacitor or supercapacitor material may partially fill the groove, completely fill the groove or overfill the groove.

The first and/or the second face of the groove may be coated with, that is may have a coat of, metal. The metal is typically in contact, normally electrical contact with the capacitor or supercapacitor material in the groove. The metal may be referred to as a conductor(s) and typically electrical conductor(s). There is typically a gap between the metal on the first face and the metal on the second face of the groove. The gap typically means that the metal on the first face of the groove is not in electrical contact with the metal on the second face of the groove. The gap is typically at the bottom of the groove.

It may be an advantage of the present invention that the groove defines a space between the metal on the first face and metal on the second face. The distance between the metal conductor on the first face is typically accurately defined, normally relatively accurately defined and/or consistent.

It may be an advantage of the present invention that the capacitor or supercapacitor material in the groove is less likely to suffer from the effects of voltage breakdown, compared to other known capacitors and supercapacitors. The energy storage device according to the present invention has reduced individual voltage across each groove. The number of grooves relates to the operating voltage of the device. Unlike other known capacitor/supercapacitor devices that require multiple laminated layers, the energy storage device according to the present invention does not require multiple laminated layers but rather uses a series of grooves in one layer. The device shares the voltage over a number of grooves so that the voltage in each individual groove is below the breakdown level for the capacitor or supercapacitor material in the groove.

The energy storage device may also be an optoelectronic device. The first face of the groove may be coated with, that is may have a coat of, a semiconductor material and the second face of the groove coated with, that is may have a coat of, a conductor material.

The capacitor material is typically a high dielectric material. It may be an advantage of the present invention that the high dielectric material aids operation of the optoelectronic device by smoothing out energy demand spikes, such as a surge when devices are turned on. The high dielectric material may be a high dielectric capacitor material.

The semiconductor material and the conductor material may be in contact with another semiconductor material in the groove. The capacitor or supercapacitor material typically one or more of coats, is on top of, and covers the another semiconductor material in the groove. The capacitor or supercapacitor normally fills any remaining volume of the groove not occupied by the semiconductor material, conductor material and/or the another semiconductor material.

The capacitor or supercapacitor material typically provides the function of a supercapacitor, also referred to as an ultracapacitor. The function of the supercapacitor may be provided by the supercapacitor material alone or may require the interaction of the supercapacitor material with one or more of the semiconductor material, conductor material and another semiconductor material.

The capacitor or supercapacitor material may store electrical energy using static double-layer capacitance and/or electrochemical pseudocapacitance or any separation of charge mechanism.

When the first face of the groove is coated with a semiconductor material; the second face of the groove coated with a conductor material; and/or there is another semiconductor material in the groove, the capacitor or supercapacitor material may be in the groove and overfill the groove. That is the capacitor or supercapacitor material is a dielectric and/or insulator between two neighbouring grooves.

It may be advantageous for the capacitor or supercapacitor material to overfill the groove, such that the material completely fills any remaining volume of the groove and also extends outside the and/or the volume of the groove. The capacitor or supercapacitor material may overfill a plurality of grooves in this way to the extent that the capacitor or supercapacitor material bridges across a plurality of grooves, forming a layer over them. The capacitor or supercapacitor material may be a dielectric between two or more adjacent grooves. Overfilling the groove(s) may result in greater adhesion of the capacitor or supercapacitor material to the substrate and/or other components of the device, and/or may increase the resulting capacitance of the device.

In use, the optoelectronic device typically generates electrical energy. The optoelectronic device may be in electrical communication with a load. The load is typically an electrical component that consumes electric energy. The load may for example be a light bulb.

In use, the capacitor or supercapacitor material typically stores electrical energy or charge that the load does not consume. In this way, excess electrical energy can be stored for future use by the load. There is therefore electrical energy available to the load when the optoelectronic device is not generating electrical energy.

A first side of the groove typically comprises the first face of the groove and a first surface of the substrate adjacent the groove. A second side of the groove typically comprises the second face of the groove and a second surface of the substrate adjacent the groove. The first and second surfaces adjacent the groove are typically at least substantially parallel with and/or in the same plane as the substrate. The first and second side of the groove are typically on the same surface of the substrate.

The first and second faces of the groove are typically from 1000 nm to 3 microns long, normally about 10 nm long. The first and second faces of the groove are typically from 100 nm to 30 microns high, normally about 1-3 microns nm high.

The length of the first face of the groove is normally measured from a junction between the first face of the groove and the first surface of the substrate and a junction between the first and second faces of the groove. The length of the second face of the groove is normally measured from a junction between the second face of the groove and the second surface of the substrate and a junction between the second and first faces of the groove.

The length of the first and second faces of the groove may be at least substantially the same or different.

The first and second sides of the groove are normally each coated with the conductor material and optionally a semiconductor material. The semiconductor material on the first side of the groove and the conductor material on the second side of the groove are typically in contact with the another semiconductor material in the groove.

At the second side of the groove there may be a gap between the semiconductor material on the second side of the groove and the another semiconductor material in the groove.

It may be an advantage of the present invention that, in use, the gap between the semiconductor material on the second side of the groove and the another semiconductor material in the groove one or more of stops, mitigates and substantially reduces the occurrence of shunting across the groove and therefore typically between the first and second sides of the groove by displacing the another semiconductor material.

The gap is typically an air gap. The gap may be filled with another material, preferably a non-conducting and/or electrically insulative material. The gap is typically a form of electrical insulation between the semiconductor material on the second side of the groove and the another semiconductor material in the groove. In an alternative embodiment the capacitor or supercapacitor material in the groove is replaced with the air gap. The air gap is a capacitor or supercapacitor, albeit typically a relatively weak capacitor or supercapacitor.

The gap may be filled with the capacitor or supercapacitor material. The gap between the semiconductor material and the another semiconductor material at the second side of the groove, typically means that the another semiconductor material is not in contact and/or is insulated from, the semiconductor material.

The gap between the semiconductor material on the second side of the groove and the another semiconductor material in the groove may be at least 1 nm in length, normally at least 20 nm in length and typically at least 100 nm in length. The gap between the semiconductor material on the second side of the groove and the another semiconductor material in the groove may be at least 100 nm in length, normally at least 300 nm in length and typically at least 500 nm in length.

It may be an advantage of the present invention that the gap makes the optoelectronic device less susceptible, typically resistant, to shorting and/or shunting across the groove. The gap between the semiconductor and the another semiconductor material is designed to mitigate a charge transfer path/route from the semiconductor material on one side of the groove, through the another semiconductor and into the semiconductor material on the opposite side of the groove. This typically makes the optoelectronic device less susceptible to shunting.

The first face of the groove is normally at a first angle relative to a normal from the substrate and the second face of the groove is normally at a second angle relative to the normal from the substrate. The first and second angles are normally from 25 to less than or equal to 90°.

The first and the second face of the groove typically define a cavity of the groove therebetween.

The first and second faces of the groove may each have a first and a second end. The first ends are typically in contact at the centre of the groove and/or bottom of the cavity, the second ends detached at a top of the cavity. In an alternative embodiment the first and second faces separately contact a base of the groove. The base of the groove may be a bottom of the groove.

The semiconductor material may be a layer of semiconductor material. The conductor material may be a layer of conductor material. The layer of semiconductor material is typically on top of the layer of conductor material. The layer of conductor material is typically underneath the layer of semiconductor material. The conductor material is normally in contact with one or more of the first face, first surface, second face and second surface of the groove and the semiconductor material.

The conductor material is normally one or more of on, in contact with and coated on the second face of the groove and second surface of the substrate adjacent the groove. The conductor material may further be one or more of on, in contact with and coated on the first surface of the substrate adjacent the groove.

The semiconductor material is normally one or more of on, in contact with and coated on the first face of the groove and first surface of the substrate adjacent the groove. The semiconductor material may further be one or more of on, in contact with and coated on the second surface of the substrate adjacent the groove.

The first and/or second sides of the groove may each be coated with an adhesive material. The adhesive material may be a layer of adhesive material. The layer of adhesive material is typically in contact with one or more of the first face, first surface, second face and second surface of the groove, the conductor material and the semiconductor material.

The adhesive material may also be a conductor, typically an electrical conductor. The conductor material coated on the first face of the groove and the adhesive material may be the same material and/or the same layer.

The another semiconductor typically at least partially fills the groove between the first and second faces of the groove. The capacitor or supercapacitor material in the groove typically fills the remaining space in the groove between the first and second faces of the groove.

The groove may be any shape, may be symmetrical, may be an asymmetric v-shape. The first face of the groove may be longer than the second face of the groove or the second face of the groove may be longer than the first face of the groove.

When the first face of the groove is longer than the second face of the groove the first face is typically at least 1000 nm long and the second face is typically at least 300 nm long. When the second face of the groove is longer than the first face of the groove the second face is typically at least 1000 nm long and the first face is typically at least 300 nm long.

When the first face of the groove is longer than the second face of the groove or the second face of the groove is longer than the first face of the groove, the groove typically has an asymmetric shape.

The another semiconductor material typically contacts only the first face of the groove and/or the semiconductor material on the first side of the groove and the another semiconductor contacts only the second face of the groove and/or the conductor material on the second side of the groove.

The semiconductor material may coat and/or cover from 20 to 80%, normally from 40 to 60% and optionally about 50% of the first face of the groove. The semiconductor material may coat and/or cover about 75% of the first face of the groove. The conductor material may coat and/or cover from 20 to 80%, normally from 40 to 60% and optionally about 50% of the second face of the groove. The conductor material may coat and/or cover about 75% of the second face of the groove.

It may be an advantage of the present invention that when the conductor material and/or semiconductor material coat and/or cover about 50%, preferably about 75%, of the second face and/or first face of the groove respectively, one or more of the efficiency, electrical current generated, power output and photoelectric conversion efficiency of the optoelectronic device is increased.

The coat of the conductor material and/or semiconductor material may be from 20 nm to 1000 nm thick, normally from 25 nm to 500 nm thick and typically from 30 nm to 200 nm thick. The coat of the conductor material and/or semiconductor material may therefore be referred to as a relatively thin coating.

It may be an advantage of the present invention that when the another semiconductor thickness is about 200 nm, one or more of the efficiency, electrical current generated, power output and photoelectric conversion efficiency of the optoelectronic device is increased. When the another semiconductor thickness is about 200 nm, the width of the groove may be about 1 µm, although this may vary for different groove shapes.

There is typically an aperture in the another semiconductor material. The aperture may be referred to as a gap and/or crack. The shape of the aperture is typically substantially conformal with the shape of the groove. The shape of the aperture may match the shape of the groove.

The capacitor or supercapacitor normally fills the aperture in the another semiconductor material.

The capacitor or supercapacitor material may be and/or may be referred to as a dielectric and/or insulator material. The insulator material is typically an electrical insulator material.

It may be an advantage of the present invention that the insulator material makes the optoelectronic device less susceptible to shorting and/or shunting across the groove. The insulator material normally insulates, typically electrically insulates, the semiconductor material on the second surface of the substrate adjacent the groove from the another semiconductor in the groove. The insulator material may increase the length of and/or mitigate a charge transfer path/route across the top of the groove and this typically makes the optoelectronic device less susceptible to shunting.

The semiconductor material is typically an n-type semiconductor material. The another semiconductor material is typically a p-type semiconductor material. In an alternative embodiment the semiconductor material is a p-type semiconductor material and the another semiconductor material is an n-type semiconductor material.

The n-type and p-type semiconductors may comprise one or more of silicon, amorphous silicon, hydrogenated amorphous silicon, aluminium, germanium, gallium nitride, gallium arsenide, aluminium phosphide, aluminium arsenide, copper iodide, zinc oxide, lead sulphide, selenium, boron phosphide, boron arsenide, gallium, indium nitride, indium phosphide, cadmium selenide, cadmium sulphide, cadmium telluride, zinc sulphide, zinc selenide, zinc telluride, copper chloride, copper sulphide, copper oxide, tin sulphide, tin telluride, zinc phosphide, titanium oxide, tin oxide, lithium niobate, lead iodide, gallium selenide, tin sulphide, iron oxide, nickel oxide, copper indium selenide, copper zinc tin sulphide, iron disulphide, copper zinc antimony sulphide, tungsten oxide, niobium pentoxide and lead oxide.

The n-type semiconductor typically comprises one or more of silicon, germanium, phosphorus, selenium, tellurium, cadmium sulphide, zinc, indium, titanium, niobium, nickel, tin, oxides of the above and doped semiconducting oxides.

The p-type semiconductor typically comprises one or more of silicon, germanium, cadmium telluride, copper indium gallium selenide ('CIGS'), copper indium gallium diselenide, copper indium selenide (CIS), copper gallium selenide, copper oxide, nickel oxide, tungsten oxide, boron, beryllium, zinc, cadmium, copper zinc tin sulphide (CZTS), perovskite, calcium titanium oxide, calcium titanate and lead sulphide.

The another semiconductor material may be an electron blocking material such as molybdenum trioxide. The electron blocking material may be a hole transporting, electron blocking material, such as vanadium pentoxide, tungsten oxide, tantalum pentoxide, spiro-polymers, and p-dot polymers. The semiconductor material may be a heterojunction, that is a mixture of one or more of a p-type semiconductor, n-type semiconductor and donor acceptor material.

The semiconductor and another semiconductor materials may meet at an interface and/or boundary. The interface is typically referred to as a p-n junction. The semiconductor and another semiconductor materials may together be referred to as an active material. The semiconductor and the another semiconductor are typically different materials.

The conductor material is typically ohmic and/or an ohmic contact to the another semiconductor material. The semiconductor material is typically rectifying and/or a rectifying contact to the another semiconductor material.

The active material in the groove and/or in the cavity of the groove and on the first and second faces of the groove may provide ohmic and rectifying contacts for insertion or extraction of charge from the active material. The active material may be one or more of photovoltaic, light emitting and ion conducting.

The conductor material may be an electrical conductor. The conductor material may comprise one or more of aluminium, bismuth, cadmium, chromium, copper, gallium, gold, indium, lead, magnesium, manganese, samarium, scandium, silver, tin, zinc, terbium, selenium, molybdenum, yttrium, holmium, calcium, nickel, tungsten, platinum, palladium and vanadium.

The substrate may comprise a first and a second series of grooves and a channel therebetween. The groove referred to above may be any one of the grooves of the first and/or second series of grooves. The channel typically transects the grooves of the first and second series of grooves.

It may be an advantage of the present invention that the channel separates the first and second series of grooves such that an electrical current can be taken from or supplied to the first series of grooves in isolation from the second series of grooves.

The first and second series of grooves are typically elongate grooves. The channel between the first and second series of grooves is typically an elongate channel.

The channel typically transects the grooves of the first and second series of grooves at or towards an end of each groove. The channel typically transects or crosses the grooves of the first series of grooves towards an end of each groove and then passes between the first and second series of grooves before transecting or crossing the grooves of the second series of grooves towards an opposite and/or opposing end of each groove.

Normally a portion, normally a substantial portion, of the first and second series of grooves and channel therebetween are substantially parallel, typically parallel to one another.

The channel may extend both perpendicular to and parallel to the first and second series of grooves. Normally the channel is perpendicular to the first and second series of grooves when it extends across the ends of the first and second series of grooves. Normally the channel is parallel to the first and second series of grooves when it extends between the first and second series of grooves. The angle at which the channel may extend across the ends of the first and second series of grooves can be variable and optionally be from 0 to 90°, normally from 35 to 55° and typically be 45°.

When the channel extends both perpendicular to and parallel to the first and second series of grooves, the channel may be referred to as running in at least two directions to connect said first and second series of grooves.

When the channel extends substantially perpendicular and across the ends of the first and second series of grooves, it may also extend in at least two directions relative to the first and second series of grooves. When the channel extends in at least two directions relative to the first and second series of grooves it typically forms a zigzag shape.

A surface of the substrate comprising the groove may be referred to as a structured surface. The structured surface is typically not flat. The substrate may have another surface that is flat.

The channel may be referred to as a delineation feature. The channel typically separates the first and second series of grooves. The channel typically has a first and a second side. The first side of the channel typically comprises a first face of the channel and a first surface of the substrate adjacent the channel. The second side of the channel typically comprises a second face of the channel and a second surface of the substrate adjacent the channel. The first and second surfaces adjacent the channel are typically at least substantially parallel with and/or in the same plane as the substrate. The first and second side of the channel are typically on the same surface of the substrate. The first and second sides of the channel are typically coated with the conductor material and the semiconductor material.

There is typically a channel cavity between the first and second faces of the channel.

The first face of the channel is typically at a first angle relative to a normal from the substrate and the second face of the channel is typically at a second angle relative to a normal from the substrate. The first face of the channel and the second face of the channel may be perpendicular to the plane of the substrate. The first angle is normally from 45 to less than or equal to 90°. The second angle is normally from 45 to less than or equal to 90°.

There is usually no electrical communication between the conductor material on the second side and/or face of the channel, semiconductor material on the first side and/or face of the channel and the another semiconductor material in the channel.

A first side and a second side of the channel may provide the positive and negative poles of an electrical circuit. The first side of the channel may be in electrical communication, typically attached to, the positive or negative pole of the electrical circuit. The second side of the channel may be in electrical communication, typically attached to, the other pole, that is the negative or positive pole respectively of the electrical circuit.

The channel is typically non-conductive. The channel typically separates and/or insulates the first and second sides of the channel from one another.

There may be more than one channel between the first and the second series of grooves. It may be an advantage of the present invention that the more than one channel helps to mitigate the effects of voltage breakdown across the energy storage device.

The optoelectronic device may be referred to as a two terminal device. The first and second series of grooves may be referred to as cascaded groove structures. In use the device may be fabricated in a series arrangement and operated in a parallel or a combined series and parallel arrangement.

The channel cavity between the first and second faces of the channel may be any shape and is normally U-shaped, V-shaped or semi-spherical. The channel cavity between the first and second faces of the channel may have a flat bottom. The shape of the cavity between the first and second faces of the first and second series of grooves may be the same or different to the shape of the channel cavity between the first and second faces of the channel.

The shape of the channel may be the same or may be different to the shape of the groove.

The bottom of the channel cavity may be flat or may be rutted. The rutted bottom of the channel cavity may be referred to as uneven or rough. The rutted bottom of the channel cavity typically increases the surface area of the bottom of the channel cavity. Increasing the surface area of the bottom of the channel cavity may help to ensure the channel separates and/or insulates the first and second sides of the channel from one another.

The channel and grooves of the first and second series of grooves typically have a depth measured from an upper surface of the substrate to a point in the channel or groove furthest from the upper surface.

The depth of the channel is typically greater than the depth of the grooves of the first and second series of grooves. The depth of the channel may be at least twice the depth of the grooves of the first and second series of grooves.

The channel has a depth and a width. The depth of the channel is typically twice the width of the channel. The aspect ratio for the depth to the width of the channel is therefore typically about 2:1.

The first and second series of grooves typically form a series of ridges and cavities. The first and second series of grooves may comprise at least 2 cavities, typically from 2 to 500 cavities.

Each groove and/or the grooves of the first and second series of grooves is typically from 5 to 200 mm long, normally from 5 to 1000 mm long and preferably 330 mm long. Each groove and/or the grooves of the first and second series of grooves is typically from 0.3 to 100 µm wide, normally from 0.3 to 5 µm wide.

Each groove and/or the grooves of the first and second series of grooves may be from 5 to 200 m long, normally from 5 to 1000 m long. Each groove and/or the grooves of the first and second series of grooves is typically greater than 100 m, optionally greater than 1000 m long, normally greater than 5000 m long and may be greater than 10,000 m long. Each groove and/or the grooves of the first and second series of grooves is typically from 0.3 to 100 µm wide, normally from 0.3 to 5 µm wide.

The substrate may comprise a curable resin and in particular a UV curable resin. The substrate may comprise one or more of an acrylic resin coated onto polyvinyl chloride (PVC), acrylic resin coated onto polyethylene terephthalate (PET), acrylic resin coated onto polyethylene naphthalate (PEN), a biopolymer coated onto polyvinyl chloride (PVC), a biopolymer coated onto polyethylene terephthalate (PET) and a biopolymer coated onto polyethylene naphthalate (PEN).

The optoelectronic device is typically a solar photovoltaic cell.

The optoelectronic device may comprise a first and a second substantially planar face.

The series of grooves are typically in the first substantially planar face. The series of grooves normally include a first outermost groove and a second outermost groove.

There may be a first and a second hole in the substrate. The first hole normally provides electrical communication between the first outermost groove and the second substantially planar face of the substrate and the second hole provides separate electrical communication between the second outermost groove and the second substantially planar face of the substrate.

The second substantially planar face of the substrate typically further comprises a first and a second electrical conductor, the first and second electrical conductors being electrically insulated from one another. Each groove of the series of grooves normally has a first and a second face and a cavity therebetween. The cavity is normally at least partially filled with a first semiconductor material, the first face coated with a conductor material and the second face coated with a second semiconductor material.

Sides of the first and second holes are normally coated with one or more of the conductor material, the first semiconductor material and the second semiconductor material.

The first hole typically passes through the first substantially planar face of the substrate proximate to the first outermost groove and through the first electrical conductor on the second substantially planar face of the substrate. The second hole typically passes through the first substantially planar face of the substrate proximate to the second outermost groove and through the second electrical conductor on the second substantially planar face of the substrate.

The holes typically have a diameter of from 0.5 to 2000 microns. The hole may be a slot.

The first and second holes are normally at least partially filled with an electrical conductor material. The electrical conductor material may be a conductive ink.

The energy storage device typically further comprises a protective layer. The protective layer is typically an outermost layer. The protective layer is typically on the first substantially planar face. The protective layer typically protects the series of grooves in the first substantially planar face. The protective layer may be referred to as a lamination.

The protective layer may be transparent or opaque. The protective layer of the energy storage device is typically opaque.

The protective layer is typically attached and/or bonded to the first substantially planar face and typically the series of grooves in the first substantially planar face by an adhesive. In an alternative embodiment the protective layer is an adhesive.

The adhesive is normally a dielectric material, optionally a high dielectric material. The high dielectric material may be a high dielectric capacitor material.

The substrate with the first and the second series of grooves and the channel therebetween may also comprise the first and the second holes.

The metal on the first face of the groove may be referred to as a first metal conductor. The metal on the second face of the groove may be referred to as a second metal conductor.

Statistical variation in the distance between the metal conductors on the first and second faces means that, in use, some short circuits may occur in the device if left untreated. After the conductors have been applied to the substrate, a short circuit detection and mitigation/removal process may be implemented. For example, the capacitance of the conductively coated substrate may first be measured. The measured capacitance will allow an assessment as to whether any short circuits are present therein. If mitigation or removal of any short circuits is then desired, a variable-frequency AC voltage may be passed through the conductor(s) on the conductively coated substrate.

According to a second aspect of the present invention there is provided a method of conditioning a substrate, the method comprising the steps of:

providing a substrate comprising a groove having a first and a second face, the first face of the groove having a coat of metal and/or semiconductor and the second face of the groove having a coat of metal and/or semiconductor;

supplying an AC voltage to the coat of the metal and/or semiconductor on the first or second face of the groove; and creating a gap between the coat of metal and/or semiconductor on the first face and the coat of metal and/or semiconductor on the second face.

The step of supplying the AC voltage to the coat of the metal or semiconductor on the first or second face of the groove typically supplies energy in the form of heat to the coat of the metal or semiconductor on the first or second face of the groove to create the gap.

The method normally includes the step of dissipating the energy in the form of heat across the metal or semiconductor on the first or second face of the groove.

The gap is typically created at the bottom of the groove.

The short circuits may typically occur when the metal and/or semiconductor on the first face of the groove is in contact with the metal and/or semiconductor on the second face of the groove.

The AC waveform may be adjusted so that the magnitude of the current which passes through the short circuit is high enough to raise the temperature of the metal and/or semiconductor. The energy in the form of heat is typically enough to overheat the short circuit. This typically causes the short circuit to fail. Consequently, short circuits are removed. Removal of the short circuits changes the overall impedance of the substrate, making it more difficult for a fixed AC frequency to overheat any remaining short circuits. Accordingly, the input frequency may be altered throughout the process in order to adjust to the capacitive reactance changes and changes to the overall impedance. Thus, substantially all the short circuits may be removed.

If the AC input frequency is too high, the method will use more power, and may mask the successful removal of short circuits, since the variation in impedance upon their removal will be very small. Therefore, it is preferable to use an AC input frequency that is neither too high nor too low for the short circuit mitigation/removal. The highest and lowest frequencies needed may be predicted based on the groove dimensions and the number of short circuits detected.

Alternatively, a suitable pulsed power supply can be used as an input, wherein a pulsed waveform comprises all the component frequencies that are estimated to be required over the impedance range of the circuit of conductors comprising the coat of metal and/or semiconductor on the first and/or second faces. In this scenario, variable AC frequencies do not need to be supplied separately as they are all contained within the pulsed waveform.

Features and optional features of the second aspect of the present invention may be incorporated into the first and/or third aspects of the present invention and vice versa.

In accordance with a third aspect of the present invention there is provided an energy storage device comprising:
  a substrate comprising a series of grooves, each groove having a first and a second face;
  wherein there is a capacitor or supercapacitor material in each groove.

The series of grooves are typically in one layer. In use, the device normally shares the voltage over a number of grooves.

The second face of a first groove of the series of grooves is typically in electrical communication with a first face of a second groove of the series of grooves. The second face of the first groove may be in electrical contact with the first face of the second groove.

There may be any number of grooves. The number of grooves is typically dependent on the type of capacitor or supercapacitor material in the grooves and/or width of the grooves.

There is normally more than 5 and less than 2000 grooves. Having two grooves in series compared to one groove doubles the voltage and halves the capacitance of the energy storage device. Having three grooves in series compared to one groove triples the voltage and thirds the capacitance of the energy storage device, and so on.

Features and optional features of the third aspect of the present invention may be incorporated into the first and/or second aspects of the present invention and vice versa.

Embodiments of the invention will now be described by way of example only and with reference to the accompanying drawings, in which:

FIG. 1a is a cross-sectional view of grooves of an energy storage device showing overfill according to an embodiment of the present invention;

FIG. 1b is a cross-sectional view of grooves of an energy storage device showing partial fill according to an embodiment of the present invention;

FIG. 2 is a cross-sectional view of a groove of an optoelectronic device according to an embodiment of the present invention;

Figure 3:
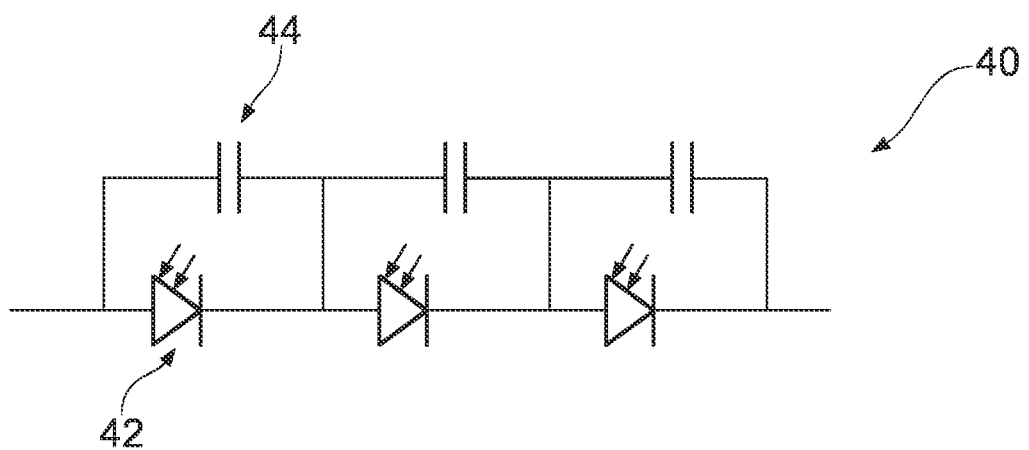
FIG. 3 is a circuit diagram for the optoelectronic device.

FIG. 1a shows the energy storage device 10 comprising a series of grooves 14 and capacitor/supercapacitor material 99. The walls of the grooves 14 have a coat of metal conductor 18.

The coat of metal 18 on the first face 16a of the groove 14 is not in electrical contact with the coat of metal 18 on the second face 16b of the groove 14. There is a gap 92 at the bottom of the groove 14 between the coat of metal 18 on the first face 16a of the groove 14 and the coat of metal 18 on the second face 16b of the groove 14. Each coat of metal 18 may also referred to as a conductor material.

In FIG. 1a the capacitor/supercapacitor material 99 overfills the grooves 14. FIG. 1b shows the same features of an energy storage device according to the present invention but the capacitor/supercapacitor material 99 only partially fills the grooves 14.

FIG. 1b shows the same energy storage device 10

FIG. 2 shows an optoelectronic device 110 comprising a substrate 112 comprising a groove 114 having a first 116a and a second 116b face and capacitor/supercapacitor material 199 in the groove 114.

The first face 116a of the groove is coated with a conductor material 118 and the second face 116b of the groove is coated with a semiconductor material 120. The conductor material 118 and semiconductor material 120 are in contact with another semiconductor material 122 in the groove. There is an aperture 126 in the another semiconductor material 122.

The first face 116a, second face 116b, conductor material 118 and semiconductor material 120 are in contact with the another semiconductor material 122. The another semiconductor 122 material has a first surface 124a substantially parallel to the first face 116a of the groove 114 and a second surface 124b substantially parallel to the second face 116b of the groove 114, the first and second surfaces 124a &124b defining the aperture 126 in the another semiconductor material 122.

The capacitor/supercapacitor material 199 covers the semiconductor material 122 in the groove 114 and fills the remaining volume of the groove 114 not occupied by the semiconductor material 120, conductor material 118 and the another semiconductor material 122.

The supercapacitor material 199 stores electrical energy generated by the optoelectronic device 110.

The groove 114 is v-shaped. The shape of the aperture 126 is conformal with the shape of the groove 114. The shape of the aperture 126 matches the shape of the groove 114.

The first 116a and the second 116b face of the groove define a cavity of the groove 114 therebetween. FIG. 2 shows the aperture 126 extending down into the cavity between the first 116a and second 116b face of the groove 114. The another semiconductor material 122 occupies 75% of the volume of the cavity of the groove 114. A remaining 15% corresponds to the aperture 126 in the another semiconductor material 122 that is filled with the supercapacitor material 199. It is appreciated that the conductor material 118 and semiconductor material 120 occupy some of the cavity space and therefore account for some of the volume of the cavity not occupied by the another semiconductor material 122 and supercapacitor material 199, although this volume is relatively small.

The aperture 126 in the another semiconductor material extends 50% of the distance into the cavity; the conductor material 118 coats 50% of the first face 116a of the groove 114; and the semiconductor material 120 coats 50% of the second face 116b of the groove 114.

FIG. 3 is an electrical circuit diagram 40 for the optoelectronic device 110 (shown in FIG. 2). The circuit diagram 40 shows diodes 42 and capacitors 44. The semiconductor material 120, conductor material 118 and the another semiconductor material 122 (shown in FIG. 2) make up the diodes 42. The capacitor/supercapacitor material 199 (shown in FIG. 2) is the capacitor 44.

FIG. 3 shows three parallel electrical circuits for three parallel grooves of the optoelectronic device. FIG. 2 shows one groove 114 of a series of grooves.

Figure 4:
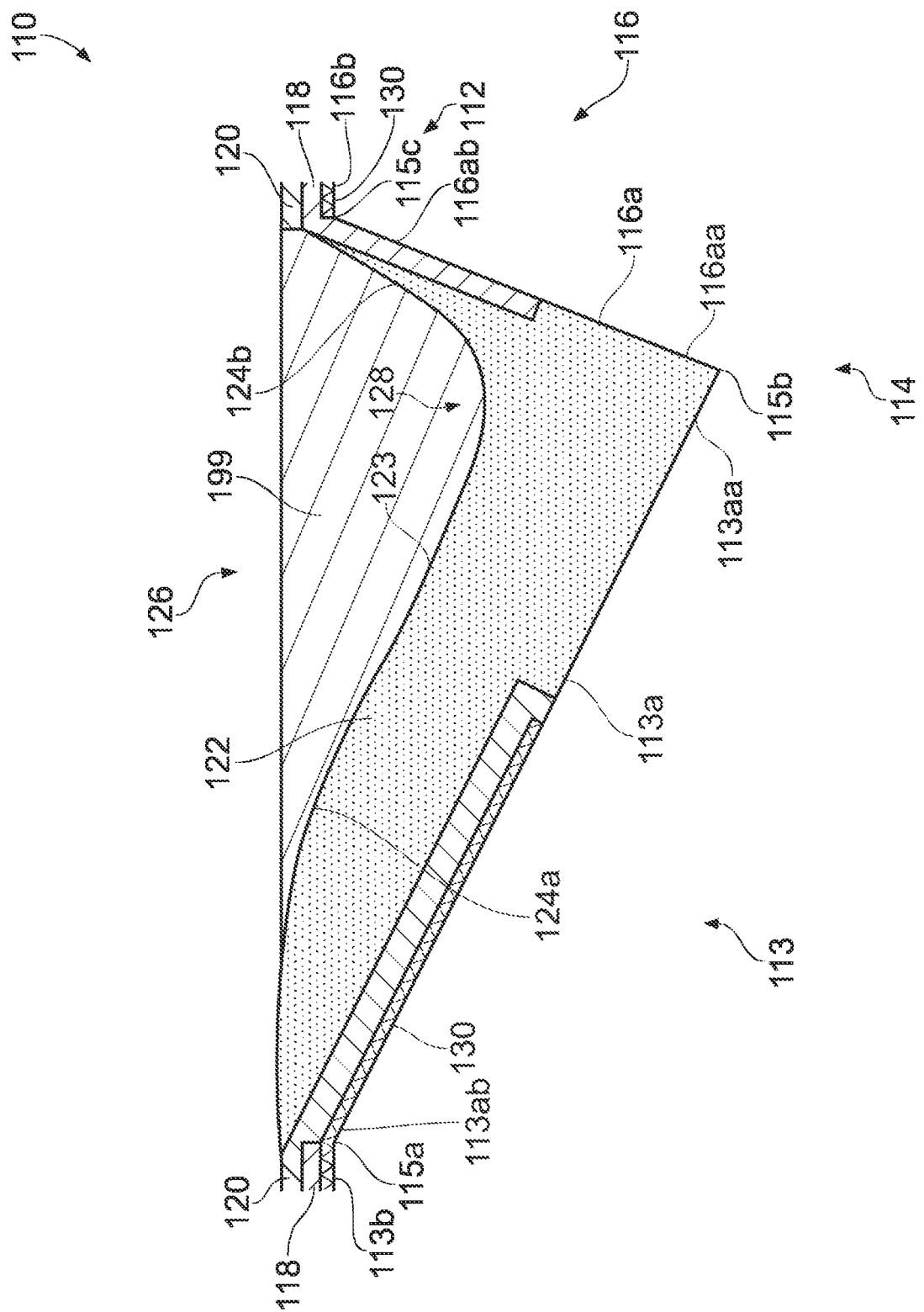
FIGS. 4 to 13 show optoelectronic devices according to various embodiments of the present invention.

FIG. 4 shows an optoelectronic device 110 comprising a substrate 112 comprising a groove 114 having a first 113a and a second 116a face. The first face 113a of the groove 114 is coated with a semiconductor material 120 and the second face 116a of the groove 114 is coated with a conductor material 118. The semiconductor material 120 and the conductor material 118 are in contact with another semiconductor material 122 in the groove 114. The first face 113a of the groove 114 is longer than the second face 116a of the groove 114.

The optoelectronic device 110 also comprises a capacitor/supercapacitor material 199.

The first 113a and the second 116a face of the groove 114 define a cavity 126 of the groove 114 therebetween. The first 113a and second 116a faces of the groove 114 each have a first 113aa, 116aa and a second 113ab, 116ab end. The first ends 113aa, 116aa are in contact at the centre of the groove 114 and bottom of the cavity 126; and the second ends 113ab, 116ab are detached at the top of the cavity 126.

The groove 114 is v-shaped. The groove 114, the another semiconductor material 122 and the cavity 126 are all asymmetrical.

A first side 113 of the groove 114 comprises the first face 113a of the groove 114 and a first surface 113b of the substrate 112 adjacent the groove 114. A second side 116 of the groove 114 comprises the second face 116a of the groove 114 and a second surface 116b of the substrate 112 adjacent the groove 114. The first and second surfaces 113b, 116b adjacent the groove 114 are in the same plane as the substrate 112.

The first face 113a of the groove 114 is longer than the second face 116a of the groove 114. The length of the first face 113a of the groove 114 is measured from a junction 115a between the first face 113a of the groove 114 and a first surface 113b of the substrate 112 and a junction 115b between the first and second faces 113a, 116a of the groove 114. The length of the second face 116a of the groove 114 is measured from a junction 115c between the second face 116a of the groove 114 and a second surface 116b of the substrate 112 and the junction 115b between the second and first faces 116a, 113a of the groove 114.

The first face 113a has a shallower slope, that is a lesser angle relative to the longitudinal axis of the substrate 112, than the second face 116b.

The optoelectronic device 110 further comprises an adhesive layer 130 comprising aluminium and/or chromium. The adhesive layer 130 may also be a conducting layer. The first 113 and second 116 sides of the groove 114 are each coated with the adhesive material 130. The adhesive layer 130 is in contact with the first face 113a, first surface 113b, and second surface 116b of the groove 114, the conductor material 118 and the semiconductor material 120.

The semiconductor material 120 is a layer of semiconductor material. The conductor material 118 is a layer of conductor material. The layer of semiconductor material 120 is on top of the layer of conductor material 118. The layer of conductor material 118 is underneath the layer of semiconductor material 120. The layer of adhesive material 130 is underneath the layer of conductor material 118 and the layer of semiconductor material 120.

The conductor material 118 is in contact with the second face 116a of the groove 114. The conductor material 118 is coated on the first surface 113b of the substrate 112 adjacent the groove 114 and the second surface 116b of the substrate 112 adjacent the groove 114.

The semiconductor material 120 is coated on the first face 113a of the groove 114 and first surface 113b of the substrate 112 adjacent the groove 114. The semiconductor material 120 is also coated on the second surface 116b of the substrate 112 adjacent the groove 114.

The another semiconductor 122 partially fills the groove 114 between the first 113a and second 116a faces of the groove 114. The another semiconductor 122 in the groove 114 has a surface 123 between the first 113a and second 116a faces of the groove 114. The surface 123 of the another semiconductor 122 is not parallel to the plane of the substrate 112. The surface 123 of the another semiconductor 122 is tilted with respect to the plane of the substrate 112.

The another semiconductor material 122 contacts the first face 113a of the groove 114 and the semiconductor material 120 on the first side 113 of the groove 114. The another semiconductor 122 also contacts the second face 116a of the groove 114 and the conductor material 118 on the second side 116 of the groove 114.

There is an aperture 128 in the another semiconductor material 122 which extends down into the cavity 126 between the first 113a and second 116a faces of the groove 114. The another semiconductor material 122 has a first surface 124a substantially parallel to the first face 113a of the groove 114 and a second surface 124b substantially parallel to the second face 116a of the groove 114, the first 124a and second 124b surfaces defining the aperture 128 in the another semiconductor material 122.

The shape of the aperture 128 matches the shape of the groove 114. The first 124a and second 124b surfaces of the another semiconductor 122 are sides of the aperture 128. The sides 124a, 124b of the aperture 128 are substantially parallel to the first 113a and second 116a faces of the groove 114 respectively.

The aperture 128 is located off-centre, that is the aperture 128 is located closer to the second face 116a of the groove 114 and farther from the first face 113a of the groove 114, such that the thickness of the another semiconductor 122 is thicker at the first face 116a of the groove 114 and thinner at the second face 116a of the groove 114. The depth of the another semiconductor material 122 at the second side 116 of the groove 114 is greater than the depth of the another semiconductor material 122 at the first side 113 of the groove 114 because the groove 114 has an asymmetric shape.

The another semiconductor material 122 occupies 75% of the volume of the cavity 126 of the groove 114. The aperture 128 in the another semiconductor material 122 extends 45% of the distance into the cavity 126 of the groove 114.

Figure 5:
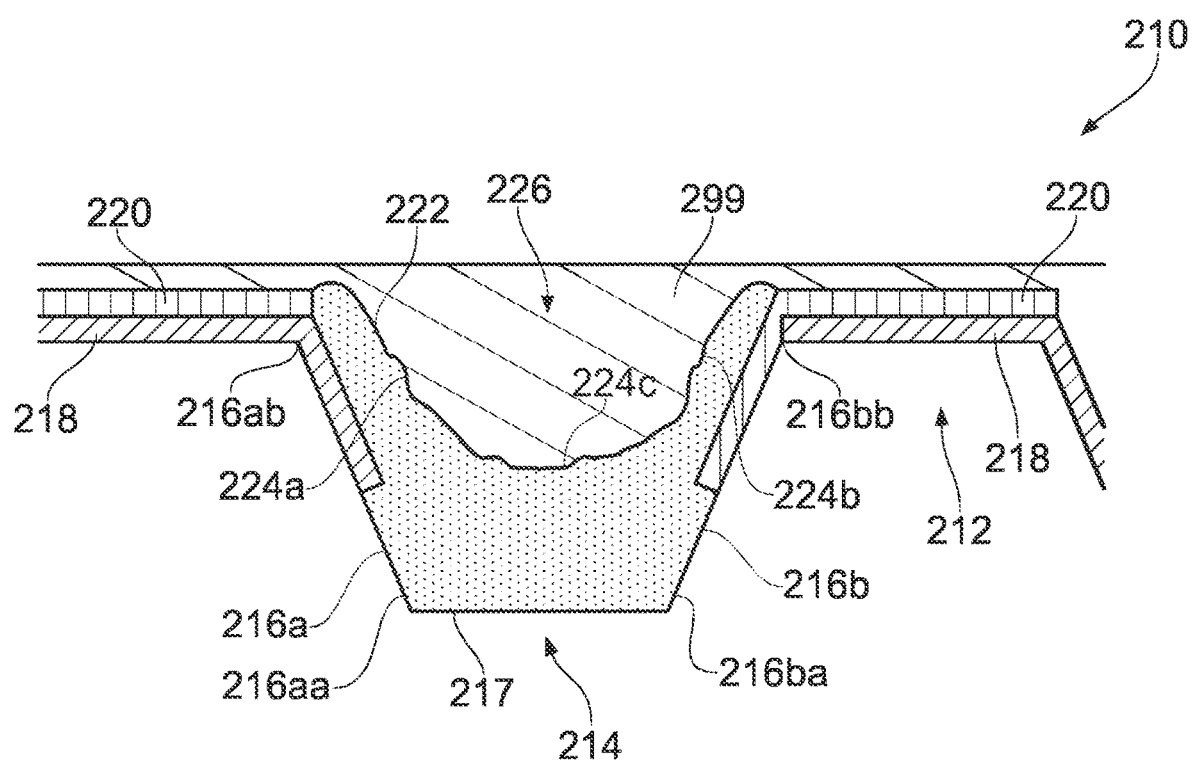

FIG. 5 shows an optoelectronic device 210 comprising a substrate 212 with a groove 214. The groove 214 comprises a first 216a and second 216b face defining a cavity 226 of the groove 214 therebetween. The groove 214 further comprises a conductor material 218, a semiconductor material 220, and another semiconductor material 222.

The optoelectronic device 210 also comprises a capacitor/supercapacitor material 299.

The conductor material 218 and the semiconductor material 220 overlap on a portion of the substrate 212, such as between two individual grooves in a series of grooves. The cavity has a flat bottom 217 with which a first end 216aa & 216ba of the first 216a and second 216b faces respectively contact with. The another semiconductor material 222 has a first surface 224a substantially parallel to the first face 216a of the groove 214, a second surface 224b substantially parallel to the second face 216b of the groove 214, and a third surface 224c substantially parallel to the flat bottom 217 of the groove 214. The first, second and third surfaces 224a, 224b and 224c define an aperture 226. The shape of the aperture 226 matches the shape of the groove 214.

Figure 6:
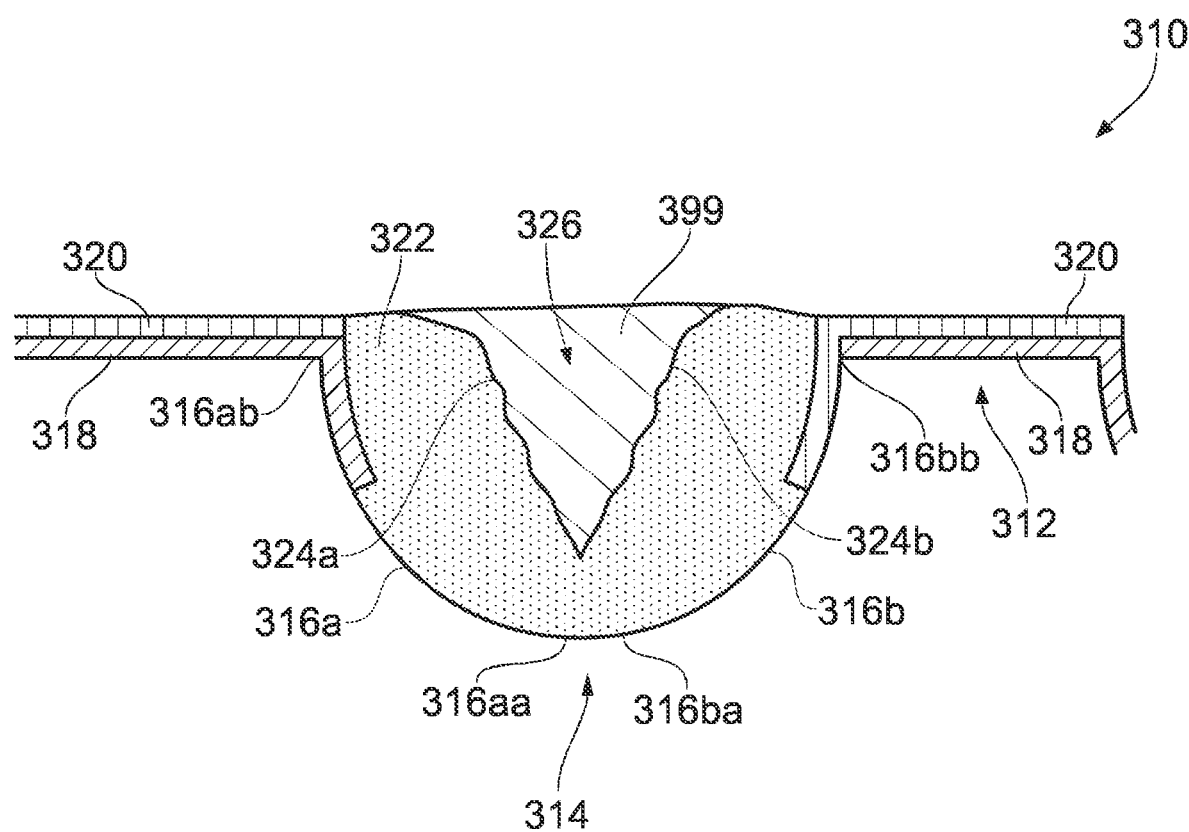

FIG. 6 shows an optoelectronic device 310. The optoelectronic device 310 comprises a substrate 312 comprising a groove 314. The groove 314 is rounded, and comprises a first face 316a, a second face 316b, a conductor material 318 and a semiconductor material 320, all in contact with another semiconductor material 322.

The optoelectronic device 310 also comprises a capacitor/supercapacitor material 399.

The conductor material 318 and the semiconductor material 320 overlap on a portion of the substrate 312, such as between two individual grooves in a series of grooves. The first 316a and second 316b faces of the groove 314 define a cavity. The another semiconductor material 322 comprises a first 324a and a second 324b surface which defines an aperture 326. The aperture 326 in the another semiconductor material 322 extends 75% of the distance into the cavity.

The first 316a and second 316b faces of the groove 314 each have a first 316aa & 316ba and a second 316ab & 316bb end. The slope of the surfaces 324a & 324b of the aperture 326 at the first ends 316aa & 316ba of the groove are steeper, that is they have a smaller angle relative to the longitudinal axis of the substrate 312, than the slope of the first 316a and second 316b faces of the groove 314, but the first 324a and second 324b surfaces of the aperture 326 are still overall substantially parallel to the first 316a and second 316b faces of the groove 314.

Figure 7:
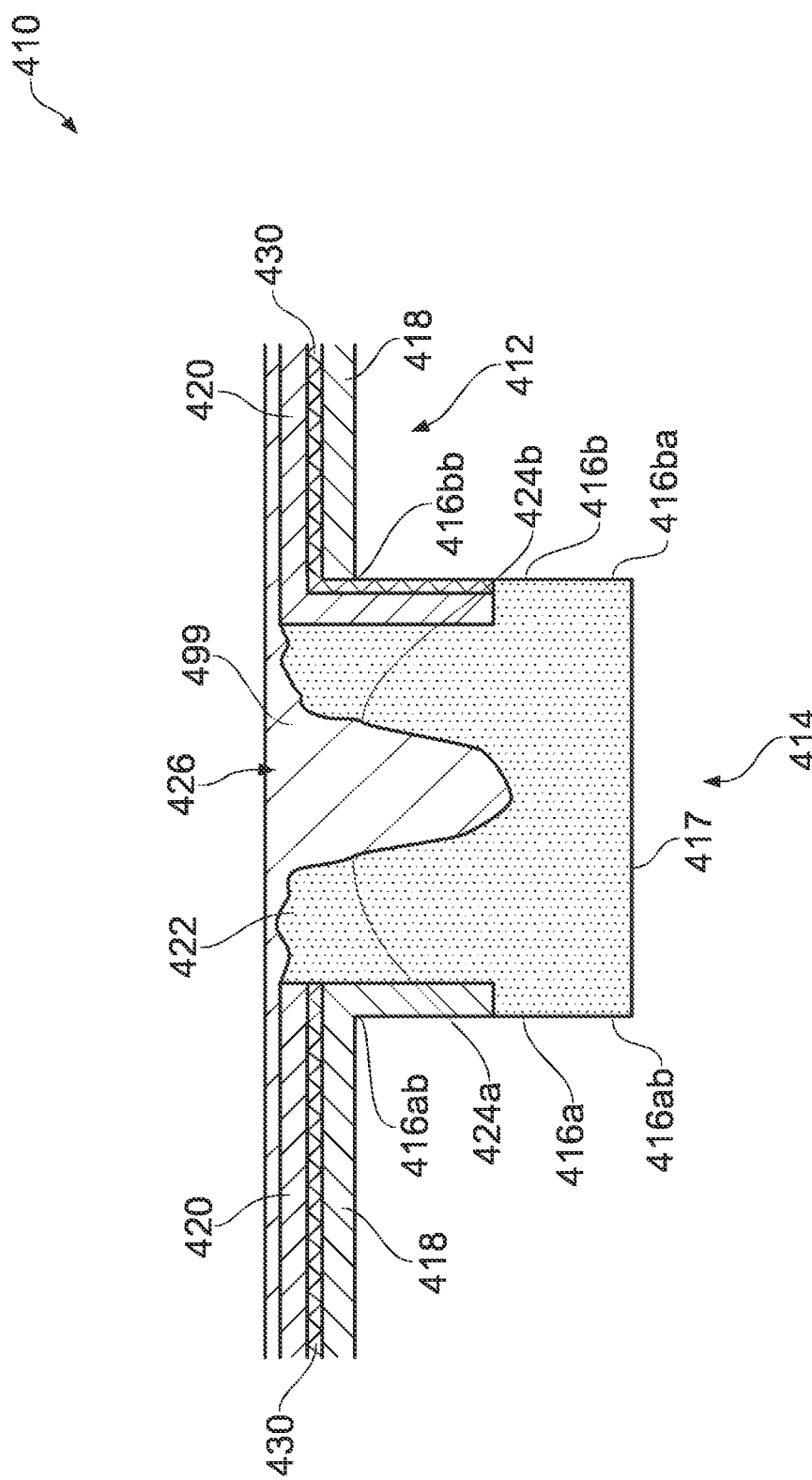

FIG. 7 shows an optoelectronic device 410. The optoelectronic device 410 comprises a substrate 412 comprising a groove 414. The groove 414 is square shaped, and as such the cavity has a flat bottom 417. The groove 414 comprises a first face 416a, a second face 416b, a conductor material 418 and a semiconductor material 420, all in contact with another semiconductor material 422.

The optoelectronic device 410 also comprises a capacitor/supercapacitor material 499.

The conductor material 418 and the semiconductor material 420 overlap in a portion of the substrate 412, such as between two individual grooves in a series of grooves. The optoelectronic device 410 further comprises an adhesion layer 430 comprising aluminium and/or chromium. The adhesion layer 430 may also be a conducting layer. The adhesion layer improves overall charge extraction from the device.

The another semiconductor material 422 comprises a first 424a and a second 424b surface which define an aperture 426. The aperture 426 is located slightly off-centre, that is the aperture 426 is located closer to the second face 416b of the groove 414 and farther from the first face 416a of the groove 414. The thickness of the another semiconductor 422 is thicker at the first face 416a of the groove 414 and thinner at the second face 416b of the groove 414. The first 416a and second 416b faces of the groove 414 are substantially vertical. The first 424a and second 424b surfaces of the aperture 426 are substantially parallel to the first 416a and second 416b faces of the groove 414. The aperture 426 is tapered in shape.

Figure 8:
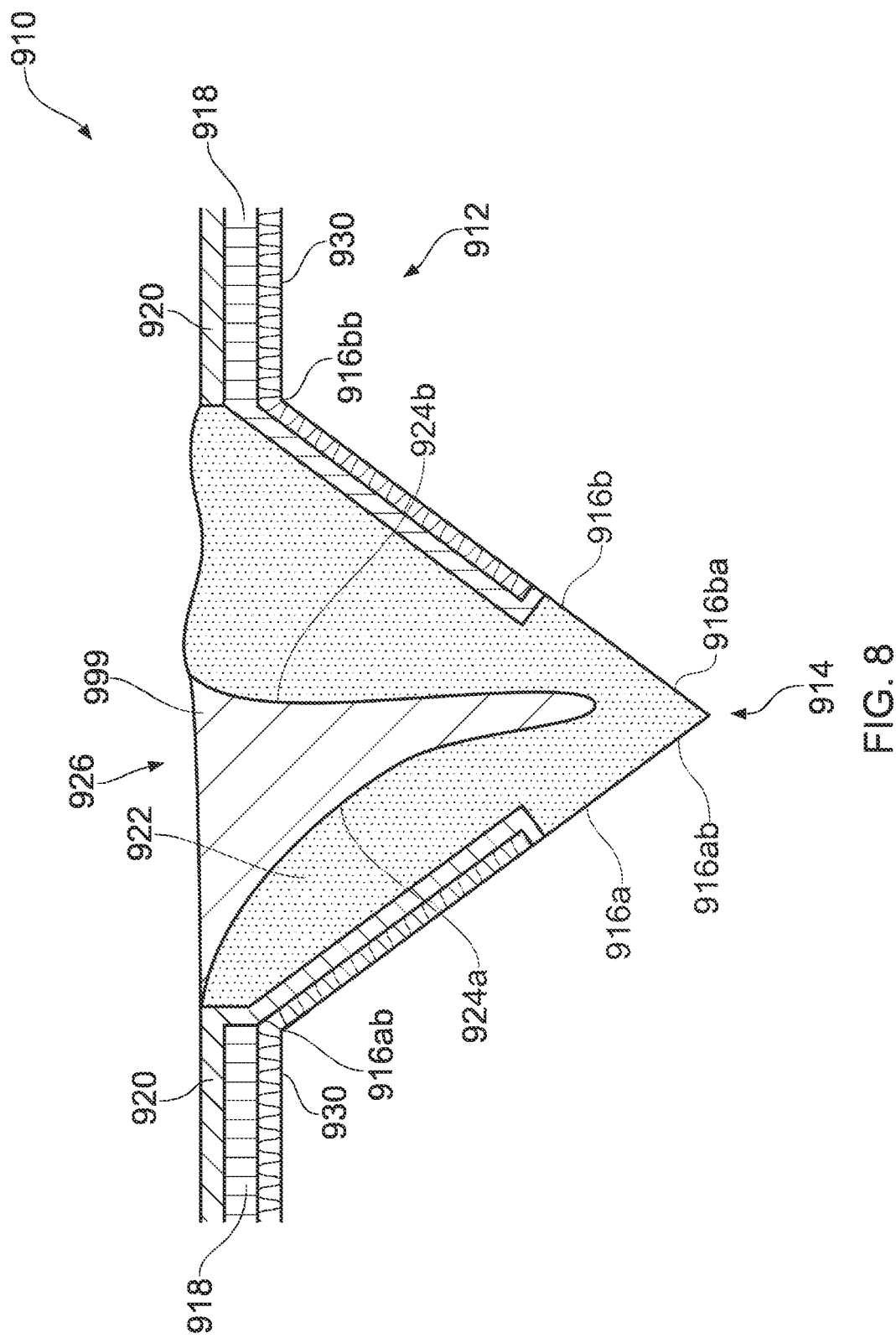

FIG. 8 shows an optoelectronic device 910 comprising a symmetrical v-shaped groove 914. The groove 914 comprises a first face 916a, a second face 916b, a conductor material 918 and a semiconductor material 920, all in contact with another semiconductor material 922.

The conductor material 918 and the semiconductor material 920 overlap on a portion of the substrate 912, such as between two individual grooves in a series of grooves. The optoelectronic device 910 further comprises an adhesion layer 930 comprising aluminium and/or chromium. The adhesion layer 930 may also be a conducting layer.

The optoelectronic device 910 also comprises a capacitor/supercapacitor material 999.

The first 916a and second 916b faces of the groove 914 define a cavity. The another semiconductor 922 material has a first surface 924a substantially parallel to the first face 916a of the groove 914 and a second surface 924b substantially parallel to the second face 916b of the groove 914. The aperture 926 is located off-centre, that is the aperture 926 is located closer to the first face 916a of the groove 914 and farther from the second face 916b of the groove 914, such that the thickness of the another semiconductor 922 is thicker at the second face 916b of the groove 914 and thinner at the first face 916a of the groove 914. The aperture 926 in the another semiconductor material 922 extends 80% of the distance into the cavity.

Figure 9:
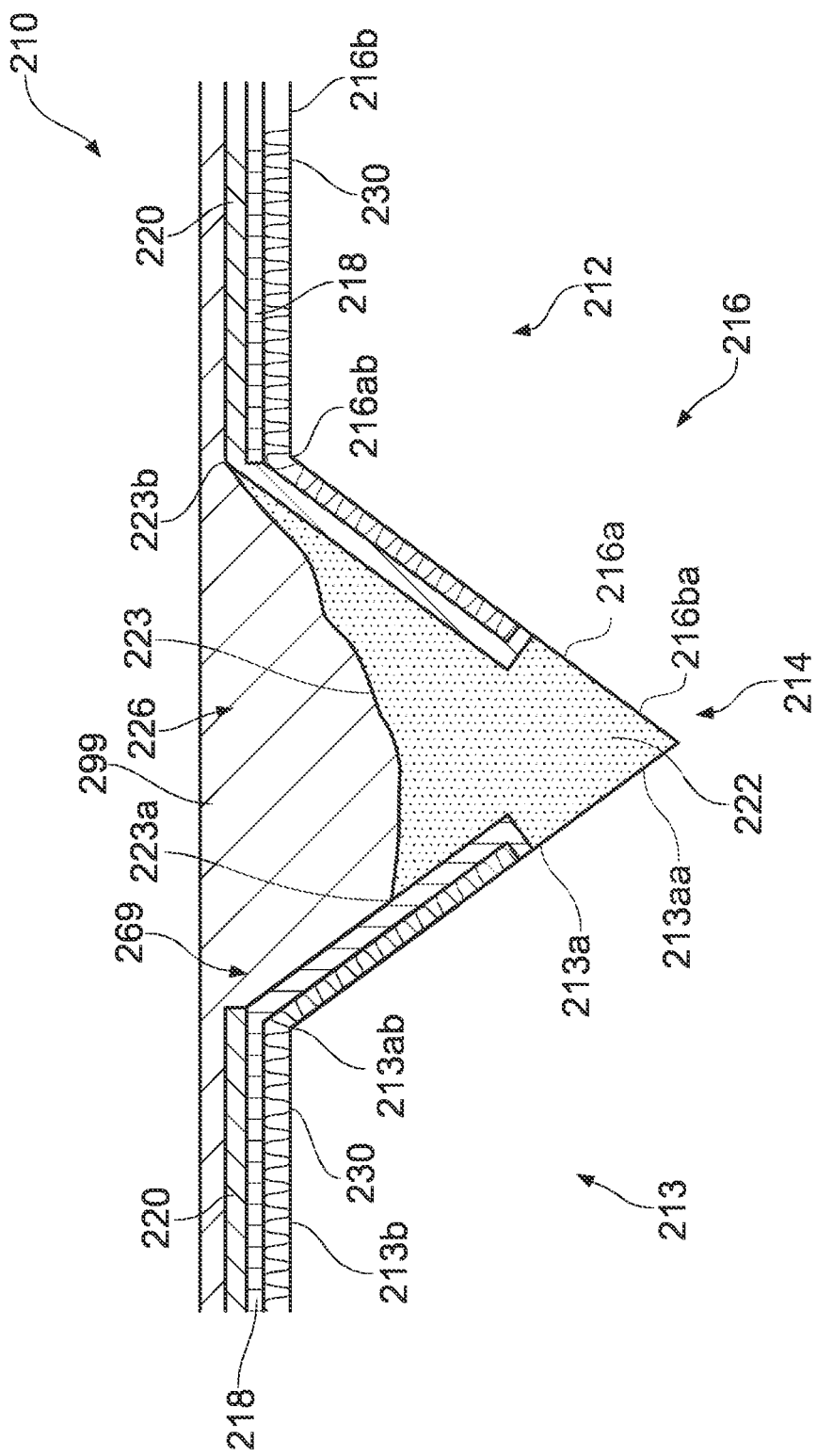

FIG. 9 shows an optoelectronic device 210. The optoelectronic device 210 comprises a substrate 212 comprising a groove 214. The groove 214 comprises a first 213a and second 216a face defining a cavity 226 of the groove 214 therebetween. The groove 214 further comprises a conductor material 218, a semiconductor material 220, and another semiconductor material 222.

The optoelectronic device 210 also comprises a capacitor/supercapacitor material 299.

The first 213a and second 216a faces of the groove 214 each have a first 213aa, 216aa and a second 213ab,216ab end. The first ends 213aa, 216aa are in contact at the centre of the groove 214. The second ends 213ab,216ab are detached at a top of the cavity 226. The groove 214 is v-shaped.

The first and second sides 213, 216 of the groove 214 are each coated with an adhesive material 230. The adhesive material 230 is a layer of adhesive material. A layer of semiconductor material 220 is on top of a layer of conductor material 218; and the layer of conductor material 218 is underneath the layer of semiconductor material 220. The layer of adhesive material 230 is underneath the layer of conductor material 218.

The layer of adhesive material 230 is in contact with the first face 213a, first surface 213b, second face 216a and second surface 216b of the groove 114, the conductor material 218 and the semiconductor material 220. The conductor material 218 coats the first face 213a of the groove 214 and first surface 213b of the substrate 212 adjacent the groove 214. The conductor material 218 also coats the second surface 216b of the substrate 212 adjacent the groove 214. The semiconductor material 220 coats the second face 216a of the groove 214 and second surface 216b of the substrate 212 adjacent the groove 214. The semiconductor material 220 also coats the first surface 213b of the substrate 212 adjacent the groove 214.

The another semiconductor 222 partially fills the groove 214 between the first 213a and second 216a faces of the groove 214. The depth 223b of the another semiconductor material 222 in the groove 214 at the second face 216a is greater than the depth 223a of the another semiconductor material 222 at the first face 213a. A surface 223 of the another semiconductor 222 is at an angle, or tilted, with respect to the plane of the substrate 212.

A gap 269 between the semiconductor material 220 and the another semiconductor material 222 at the first side 213 of the groove 214 means that the another semiconductor material 222 is not in contact with the semiconductor material 220 on the first side 213 of the groove 214.

Figure 10:
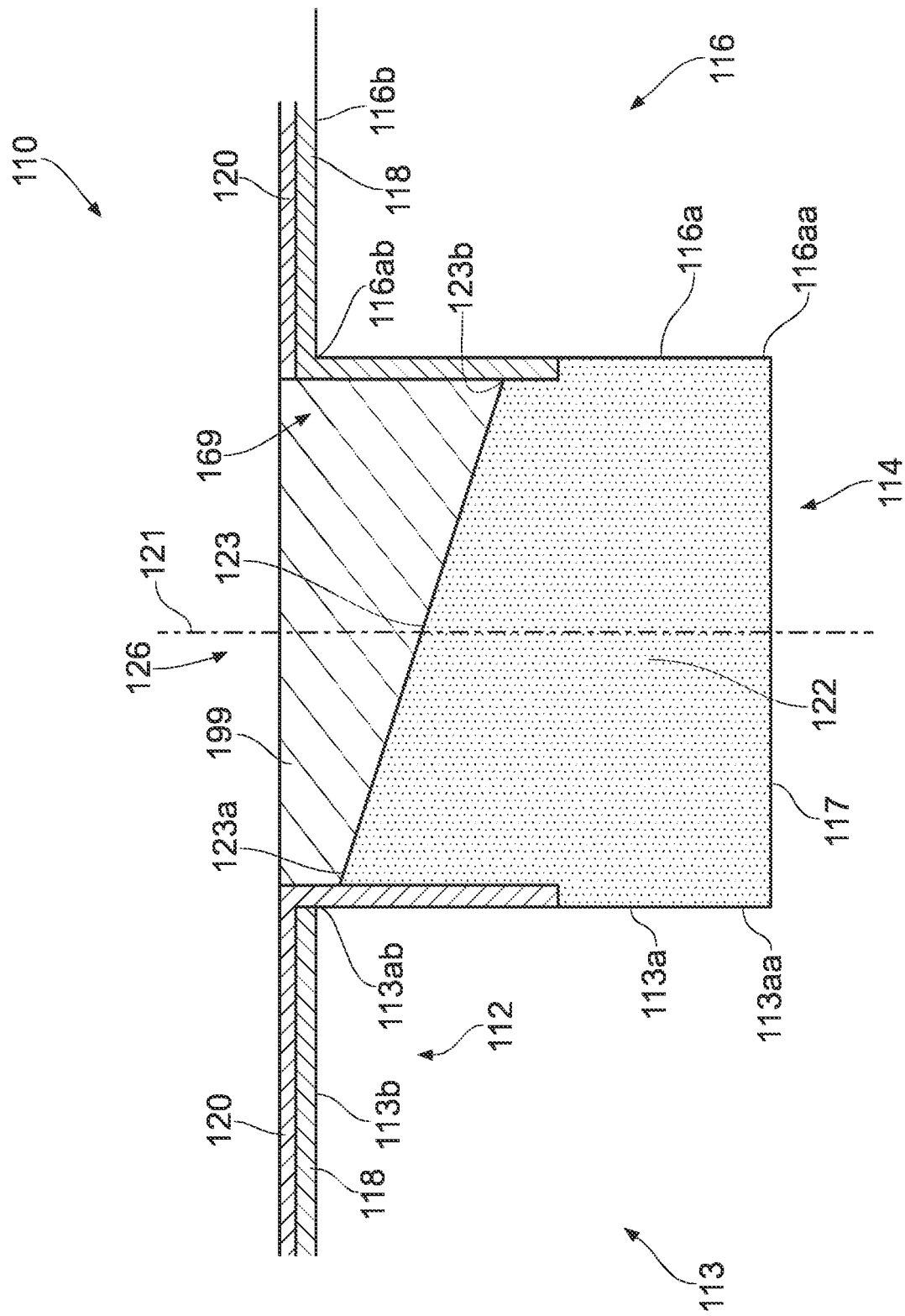

FIG. 10 shows an optoelectronic device 110 comprising a substrate 112 comprising a groove 114 having a first 113 and a second 116 side. The first 113 and second 116 sides of the groove 114 each coated with a conductor material 118 and a semiconductor material 120. The semiconductor material 120 on the first side 113 of the groove 114 and the conductor material 118 on the second side 116 of the groove 114 in contact with another semiconductor material 122 in the groove 114. At the second side 116 of the groove there is a gap 169 between the semiconductor material 120 on the second side 116 of the groove 114 and the another semiconductor material 122 in the groove 114.

The optoelectronic device 110 also comprises a capacitor/supercapacitor material 199.

The first 113 and second 116 sides of the groove 114 are substantially equal halves of the groove 114, separated by a line 121 perpendicular to the plane of the substrate 112.

The first side 113 of the groove 114 comprises a first face 113a of the groove 114 and a first surface 113b of the substrate 112 adjacent the groove 114. The second side 116 of the groove 114 comprises a second face 116a of the groove 114 and a second surface 116b of the substrate 112 adjacent the groove 114. The first 113a and the second 116a face of the groove 114 define a cavity 126 of the groove 114 therebetween. The first 113b and second 116b surfaces adjacent the groove 114 are substantially parallel with the substrate 112.

The groove 114 is square shaped. The first face 113a of the groove 114 is at a 90° angle relative to the plane of the substrate 112. The second face 116a of the groove 114 is also at a 90° angle relative to the plane of the substrate 112. The first 113a and second 116a faces of the groove 114 each have a first 113aa, 116aa and a second 113ab, 116ab end. The first ends 113aa, 116aa separately contact a flat bottom, or base, 117 of the groove 114; and the second ends 113ab, 116ab are detached at a top of the cavity 126.

The semiconductor material 120 is a layer of semiconductor material, and the conductor material 118 is a layer of conductor material. The layer of semiconductor material 120 is on top of the layer of conductor material 118; and the layer of conductor material 118 is underneath the layer of semiconductor material 120. The conductor material 118 is in contact with the second face 116a of the groove 114 and second surface 116b of the substrate 112 adjacent the groove 114. The conductor material 118 is also in contact with the first surface 113b of the substrate 112 adjacent the groove 114. The semiconductor material 120 is in contact with the first face 113a of the groove 114 and the first surface 113b of the substrate 112 adjacent the groove 114. The semiconductor material 120 is also in contact with the second surface 116b of the substrate 112 adjacent the groove 114.

The another semiconductor 122 partially fills the groove 114 between the first 113a and second 116a faces of the groove 114. The another semiconductor 122 in the groove 114 has a surface 123 between the first 113a and second 116a faces of the groove 114. The another semiconductor material 122 occupies 75% of the volume of the cavity 126 of the groove 114.

The depth 123b of the another semiconductor material 122 in the groove 114 at the second face 116a is less than the depth 123a of the another semiconductor material 122 at the first face 113a. The surface 123 of the another semiconductor 122 is at an angle, or tilted, with respect to the plane of the substrate 112. The surface 123 of the another semiconductor 122 is tilted relative to the groove 114.

The another semiconductor material 122 contacts the first face 113a of the groove 114 and the semiconductor material 120 at the first side 113 of the groove 114. The another semiconductor material 122 also contacts the second face 116a of the groove 114 and the conductor material 118 at the second side 116 of the groove 114. The semiconductor material 120 coats about 50% of the first face 113a of the groove 114. The conductor material 118 coats about 50% of the second face 116a of the groove 114.

The gap 169 between the semiconductor material 120 and the another semiconductor material 122 at the second side 116 of the groove 114 means that the another semiconductor material 122 is not in contact with the semiconductor material 120.

Figure 11:
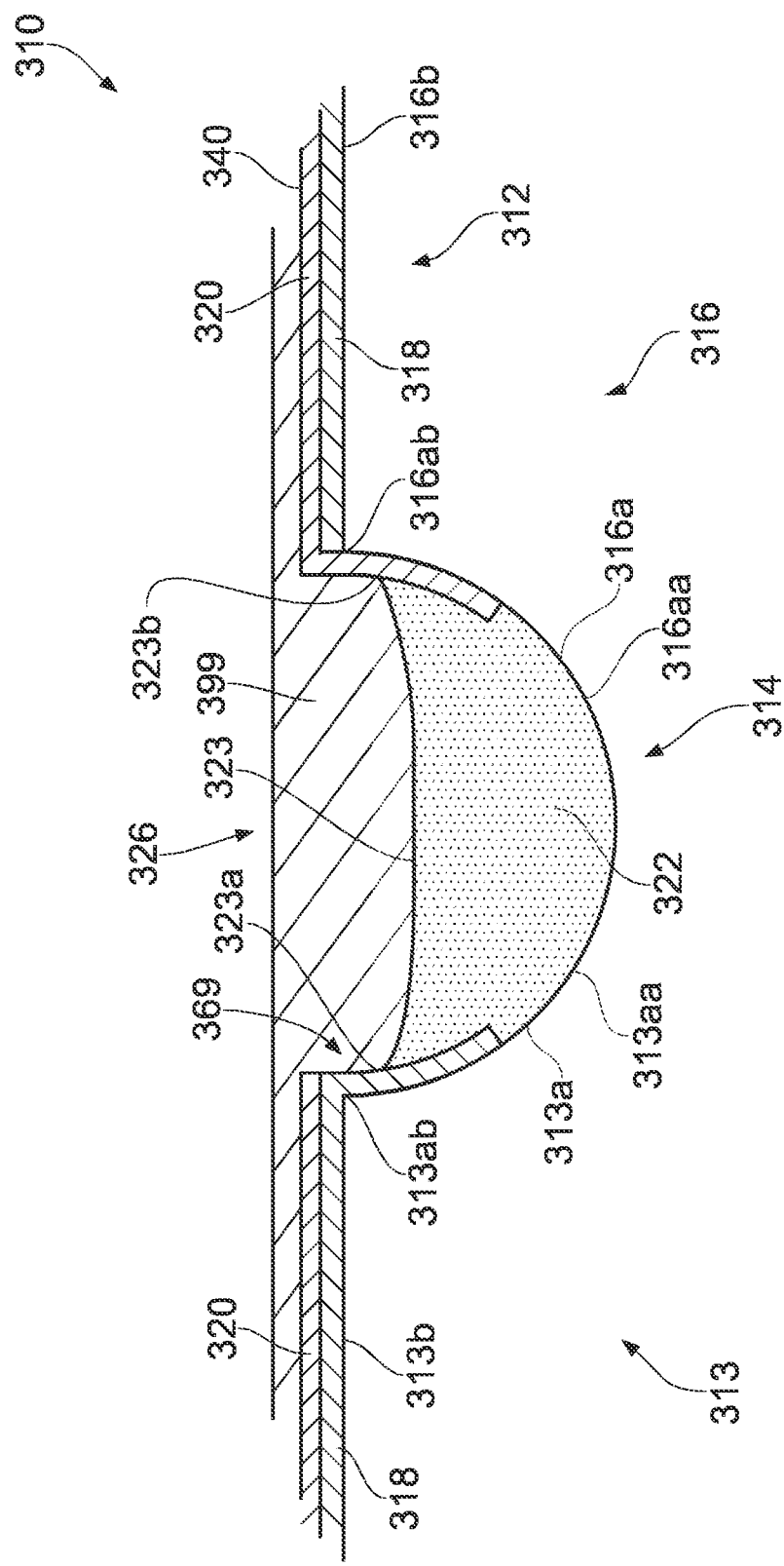

FIG. 11 shows an optoelectronic device 310. The optoelectronic device 310 comprises a substrate 312 comprising a groove 314. The groove 314 comprises a first 313a and second 316a face defining a cavity 326 of the groove 314 therebetween. The groove 314 further comprises a conductor material 318, a semiconductor material 320, and another semiconductor material 322.

The optoelectronic device 310 also comprises a capacitor/supercapacitor material 399.

The first 313a and second 316a faces of the groove 314 each have a first 313aa, 316aa and a second 313ab, 316ab end. The first ends 313aa, 316aa are in contact at the centre of the groove 314. The second ends 313ab, 316ab are detached at a top of the cavity 326. The groove 314 is rounded, that is semi-circular in shape.

A layer of semiconductor material 320 is on top of a layer of conductor material 318; and the layer of conductor material 318 is underneath the layer of semiconductor material 320. The conductor material 318 is in contact with the first face 313a of the groove 314 and first surface 313b of the substrate 312 adjacent the groove 314. The conductor material 318 is also in contact with the second surface 316b of the substrate 312 adjacent the groove 314. The semiconductor material 320 is in contact with the second face 316a of the groove 314 and coats the second surface 316b of the substrate 312 adjacent the groove 314. The semiconductor material 320 also coats the first surface 313b of the substrate 312 adjacent the groove 314.

The another semiconductor 322 partially fills the groove 314 between the first 313a and second 316a faces of the groove 314. A surface 323 of the another semiconductor 322 is meniscus shaped, or concave shaped, such that portions of the surface 323 adjacent the first 313a and second 313b faces are tilted at an angle with respect to the plane of the substrate 312.

A gap 369 between the semiconductor material 320 and the another semiconductor material 322 at the first side 313 of the groove 314 means that the another semiconductor material 322 is not in contact with the semiconductor material 320 on the first side 313 of the groove 314.

Figure 12:
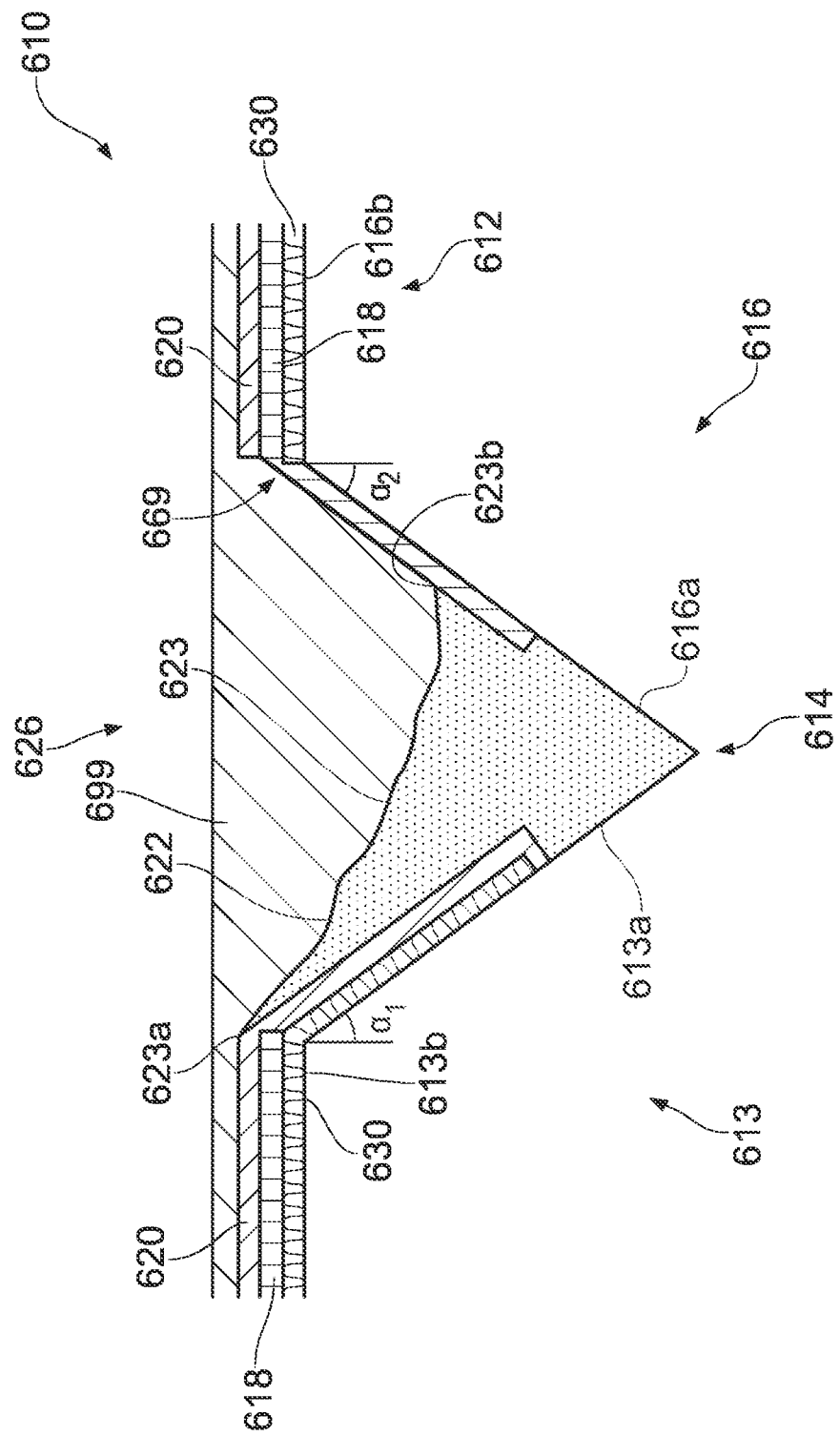

FIG. 12 shows an optoelectronic device 610. The optoelectronic device 610 comprises a substrate 612 comprising a v-shaped groove 614. The groove 614 comprises a first 613a and second 616a face defining a cavity 626 of the groove 614 therebetween. The groove 614 further comprises a conductor material 618, a semiconductor material 620, and another semiconductor material 622.

The optoelectronic device 610 also comprises a capacitor/supercapacitor material 699.

The first and second sides 613, 616 of the groove 614 are each coated with a layer of adhesive material 630. The layer of adhesive material 630 is in contact with the first face 613a, first surface 613b, and second surface 616b of the groove 614, the conductor material 618 and the semiconductor material 620.

The conductor material 618 coats the first surface 613b of the substrate 612 adjacent the groove 614. The conductor material 618 also coats the second face 616a of the groove 614 and is in contact with the second surface 616b of the substrate 612 adjacent the groove 614. The semiconductor material 620 coats the first face 613a of the groove 614 and first surface 613b of the substrate 612 adjacent the groove 614. The semiconductor material 620 also coats the second surface 616b of the substrate 612 adjacent the groove 614.

The another semiconductor 622 partially fills the groove 614 between the first 613a and second 616a faces of the groove 614. The depth 623a of the another semiconductor material 622 in the groove 614 at the first face 613a is greater than the depth 623b of the another semiconductor material 622 at the second face 616a. A surface 623 of the another semiconductor 622 is tilted with respect to the plane of the substrate 612.

A gap 669 between the semiconductor material 620 and the another semiconductor material 622 at the second side 616 of the groove 614 means that the another semiconductor material 622 is not in contact with the semiconductor material 620 on the second side 616 of the groove 614.

Figure 13:
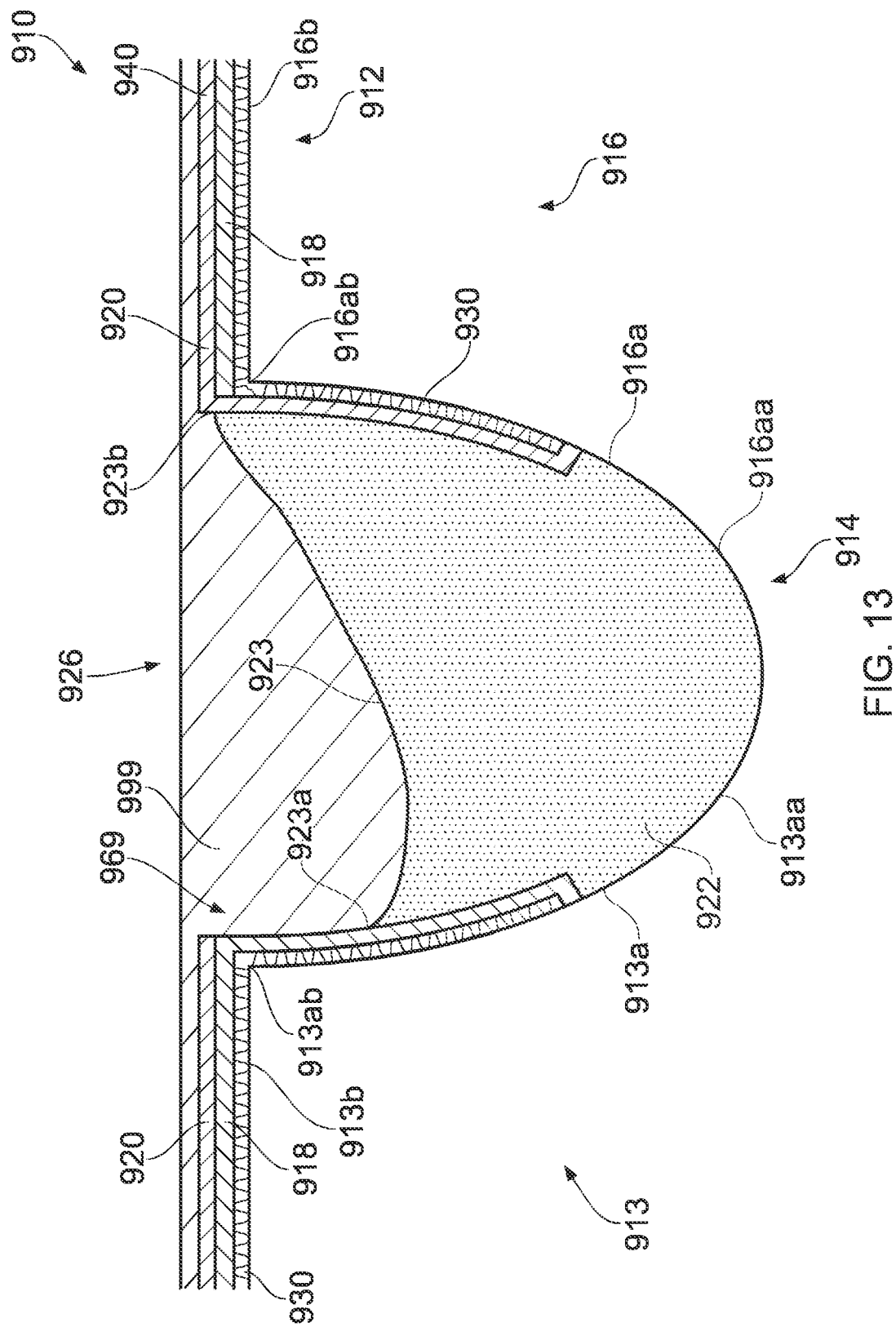

FIG. 13 shows an optoelectronic device 910 comprising a substrate 912 comprising a groove 914. The groove 914 comprises a first 913a and second 916a face defining a cavity 926 of the groove 914 therebetween. The groove 914 further comprises a conductor material 918, a semiconductor material 920, and another semiconductor material 922.

The optoelectronic device 910 also comprises a capacitor/supercapacitor material 999.

The first 913a and second 916a faces of the groove 914 each have a first 913aa, 916aa and a second 913ab, 916ab end. The first ends 913aa, 916aa are in contact at the centre of the groove 914. The second ends 913ab, 916ab are detached at a top of the cavity 926. The groove 914 is rounded.

The first and second sides 913, 916 of the groove 914 are each coated with a layer of adhesive material 930. A layer of semiconductor material 920 is on top of a layer of conductor material 918; and the layer of conductor material 918 is underneath the layer of semiconductor material 920. The layer of adhesive material 930 is underneath the layer of conductor material 918.

The layer of adhesive material 930 is in contact with the first face 913a, first surface 913b, second face 916a and second surface 916b of the groove 914, the conductor material 918 and the semiconductor material 920. The conductor material 918 coats the first face 913a of the groove 914 and first surface 913b of the substrate 912 adjacent the groove 914. The conductor material 918 also coats the second surface 916b of the substrate 912 adjacent the groove 914. The semiconductor material 920 coats the second face 916a of the groove 914 and second surface 916b of the substrate 912 adjacent the groove 914. The semiconductor material 920 also coats the first surface 913b of the substrate 912 adjacent the groove 914.

The another semiconductor 922 partially fills the groove 914 between the first 913a and second 916a faces of the groove 914. The depth 923b of the another semiconductor material 922 in the groove 914 at the second face 916a is greater than the depth 923a of the another semiconductor material 922 at the first face 913a. A surface 923 of the another semiconductor 922 is at an angle, or tilted, with respect to the plane of the substrate 912.

A gap 969 between the semiconductor material 920 and the another semiconductor material 922 at the first side 913 of the groove 914 means that the another semiconductor material 922 is not in contact with the semiconductor material 920 on the first side 913 of the groove 914.

Modifications and improvements can be incorporated herein without departing from the scope of the invention.

The invention claimed is:

1. An energy storage device comprising:
a substrate comprising a groove having a first face and a second face;
a capacitor material in the groove;
the first face of the groove having a coat of a semiconductor material;
the second face of the groove having a coat of a conductor material;
wherein the coat of the semiconductor material on the first face is not in electrical contact with the coat of the conductor material on the second face; and
wherein the energy storage device is also an optoelectronic device.

2. The energy storage device according to claim 1, wherein the groove is from 5 mm to 1000 mm long.

3. The energy storage device according to claim 1, wherein the substrate comprises a series of grooves, each groove having a first face and a second face and a capacitor material in each groove in the series of grooves, the groove of claim 1 being any one of the grooves of the series of grooves.

4. The energy storage device according to claim 3, wherein the series of grooves are in one layer and thereby voltage is shareable over a number of grooves of the series of grooves.

5. The energy storage device according to claim 3, wherein the second face of a first groove of the series of grooves is in electrical communication with the first face of a second groove of the series of grooves.

6. The energy storage device according to claim 1, wherein the semiconductor material and the conductor material are in contact with a second semiconductor material in the groove, the capacitor material covering the second semiconductor material in the groove.

7. The energy storage device according to claim 6, wherein the capacitor material also overfills the groove.

8. The energy storage device according to claim 1, wherein the first face and the second face of the groove are independently from 1000 nm to 10 microns long.

9. The energy storage device according to claim 8, wherein the length of the first face and the second face of the groove are different.

10. The energy storage device according to claim 6, wherein a first side of the groove comprises the first face of the groove and a first surface of the substrate adjacent the groove, a second side of the groove comprises the second face of the groove and a second surface of the substrate adjacent the groove, and wherein at the second side of the groove there is a gap between the semiconductor material on the second side of the groove and the second semiconductor material in the groove.

11. The energy storage device according to claim 1, wherein the first face of the groove is at a first angle relative to a normal from the substrate, the second face of the groove is at a second angle relative to the normal from the substrate, and the first angle and the second angle are independently from 25° to 90°.

12. The energy storage device according to claim 6, wherein there is an aperture in the second semiconductor material.

13. The energy storage device according to claim 1, wherein the substrate comprises a first series of grooves and a second series of grooves and a channel between the first series of grooves and the second series of grooves, the groove of claim 1 being any one of the grooves of the first series of grooves or the second series of grooves.

14. The energy storage device according to claim 13, wherein:
   the channel is perpendicular to the first series of grooves and the second series of grooves when the channel extends across ends of the first and second series of grooves, and
   the channel is parallel to the first and second series of grooves when the channel extends between the first and second series of grooves.

15. The energy storage device according to claim 13, wherein the channel has a depth of at least twice the depth of the grooves of the first series of grooves and the second series of grooves.

16. The energy storage device according to claim 1, wherein the energy storage device is also an optoelectronic device and a solar photovoltaic cell.

* * * * *